(12) United States Patent
Amako et al.

(10) Patent No.: US 8,221,963 B2
(45) Date of Patent: Jul. 17, 2012

(54) METHOD FOR PRODUCING FINE STRUCTURE

(75) Inventors: Jun Amako, Matsumoto (JP); Daisuke Sawaki, Shiojiri (JP)

(73) Assignee: Seiko Epson Corporation (JP)

( * ) Notice: Subject to any disclaimer, the term of this patent is extended or adjusted under 35 U.S.C. 154(b) by 712 days.

(21) Appl. No.: 12/342,147

(22) Filed: Dec. 23, 2008

(65) Prior Publication Data

US 2009/0170038 A1    Jul. 2, 2009

(30) Foreign Application Priority Data

Dec. 27, 2007  (JP) ................................ 2007-337900
Dec. 1, 2008   (JP) ................................ 2008-306721

(51) Int. Cl.
*G03F 7/20*    (2006.01)
*G02B 5/18*    (2006.01)

(52) U.S. Cl. ........ 430/321; 430/322; 430/323; 430/324; 430/325; 359/570

(58) Field of Classification Search .................. 430/311, 430/321, 322, 323, 324, 325; 359/570
See application file for complete search history.

(56) References Cited

U.S. PATENT DOCUMENTS 7,732,121 B2 *   6/2010  Mizutani et al. .............. 430/311
2007/0287100 A1 * 12/2007  Mizutani et al. .............. 430/311

FOREIGN PATENT DOCUMENTS

JP    2002-520677   7/2002
WO    WO-0004418   1/2000

* cited by examiner

*Primary Examiner* — Shean Wu
(74) *Attorney, Agent, or Firm* — Harness, Dickey & Pierce, P.L.C.

(57) ABSTRACT

A method for producing a fine structure includes: (a) forming a photosensitive film to cover a plurality of first convex portions formed in at least one surface of a substrate; (b) arranging liquid to cover the photosensitive film on the at least one surface of the substrate; (c) arranging a transparent parallel plate such that the parallel plate opposes the substrate via the liquid; (d) generating interference field by a laser beam to irradiate the interference field onto the photosensitive film via the parallel plate and the liquid; (e) removing the liquid and the parallel plate to develop the photosensitive film so as to form a photosensitive film pattern; and (f) etching the substrate using a mask of the photosensitive film pattern to form a plurality of fine convex portions smaller than the first convex portions on the at least one surface of the substrate. In the method, the liquid arranged at step (b) has a refractive index larger than 1 and equal to or smaller than a refractive index of the photosensitive film.

12 Claims, 17 Drawing Sheets

METHOD FOR PRODUCING FINE STRUCTURE

The entire disclosure of Japanese Patent Application No. 2007-337900, filed Dec. 27, 2007 is expressly incorporated by reference herein.

BACKGROUND

1. Technical Field

The present invention relates to a method for producing an element having a fine structure, such as an optical element.

2. Related Art

There are known diffractive optical elements that diffract incident light through a concave and convex structure provided on a surface of the element. The inventors of the present invention consider adding a function of preventing reflection of incident light to the diffractive optical element by providing convex portions much finer than the concave and convex structure in the known diffractive optical elements. Additionally, the inventors of the invention also consider adding a polarization separation function to the diffractive optical element by forming fringe-shaped convex portions (a wire grid) much finer than the concave and convex structure. Thus, when the diffractive optical element includes the concave and convex structure for diffraction and the fine convex portions for the polarization separation function that are superimposed with each other, a range of use of the element can be greatly broadened.

In many cases, the fine convex portions serving to perform the reflection preventing function or the polarization separation function are formed by a photolithographic technique using a photosensitive film. In the technique, the photosensitive film is formed to cover the concave and convex structure on a substrate, exposed to light, and developed so as to form a mask with a fine pattern. Then, etching is performed using the mask, thereby forming the fine convex portions. However, when using a conventionally known technique (e.g. spin coating or spray coating) to form the photosensitive film, a presence of the concave and convex structure under the fine convex portions allows a surface of the photosensitive film to be often made uneven. This seems mainly due to that a liquid material of the photosensitive film remains in the concave portions of the concave and convex structure. It is thus difficult to suitably form a fine structure including the concave and convex structure and the fine convex portions superimposed on the structure. That problem exists not only in production of the diffractive optical element but commonly occurs in production of a fine structure similar to the diffractive optical element. Additionally, the same technological problem can occur in formation of fine convex portions on a substrate simply having an uneven surface as well as in additional formation of fine convex portions on a concave and convex structure provided to perform some function.

JP-T-2002-520677 is an example of related art. The document discloses an example of a fine structure including fine convex portions superimposed on a concave and convex structure. However, regarding a method for producing the fine structure, there is neither sufficient disclosure nor suggestion. Thus, the above technological problem has not been solved.

SUMMARY

Therefore, an advantage of the present invention is to provide a method for efficiently producing a fine structure in which fine convex portions are formed in an uneven surface.

According to a first aspect of the invention, there is provided a method for producing a fine structure. The method includes (a) forming a photosensitive film to cover a plurality of first convex portions formed in at least one surface of a substrate; (b) arranging liquid to cover the photosensitive film on the at least one surface of the substrate; (c) arranging a transparent parallel plate such that the parallel plate opposes the substrate via the liquid; (d) generating interference field by a laser beam to irradiate the interference field onto the photosensitive film via the parallel plate and the liquid; (e) removing the liquid and the parallel plate to develop the photosensitive film so as to form a photosensitive film pattern; and (f) etching the substrate using a mask of the photosensitive film pattern to form a plurality of fine convex portions smaller than the first convex portions on the at least one surface of the substrate. In the method, the liquid arranged at step (b) has a refractive index larger than 1 and equal to or smaller than a refractive index of the photosensitive film.

In the method of the first aspect, preferably, the laser beam used at step (d) includes a plurality of laser beams that are intersected to generate the interference field. Alternatively, preferably, the parallel plate arranged at step (c) has a diffraction grating, and the laser beam used at step (d) is a single laser beam that is input to the diffraction grating to generate the interference field.

Preferably, the above method further includes forming a light-shielding layer having at least one opening on a surface of the parallel plate facing the liquid at step (c). In this case, the method, preferably, further includes forming a plurality of openings as the at least one opening at step (c), and sequentially placing a shielding plate above the parallel plate to expose each of the openings so as to irradiate the interference field onto a plurality of regions on the at least one surface of the substrate at step (d). Alternatively, the method may further include forming a single opening as the at least one opening at step (c); and moving the parallel plate to irradiate the interference field onto a plurality of regions on the at least one surface of the substrate at step (d).

According to a second aspect of the invention, there is provided a method for producing a fine structure. The method includes (a) forming a photosensitive film to cover a plurality of first convex portions formed in at least one surface of a substrate; (b) forming a water-soluble film to cover the photosensitive film on the at least one surface of the substrate; (c) generating interference field by a laser beam to irradiate the interference field onto the photosensitive film via the water-soluble film; (d) developing the photosensitive film to form a photosensitive film pattern; and (e) etching the substrate using a mask of the photosensitive film pattern to form a plurality of fine convex portions smaller than the first convex portions on the at least one surface of the substrate. In the method, the water-soluble film formed at step (b) has a refractive index larger than 1 and equal to or smaller than a refractive index of the photosensitive film.

In the method of the second aspect, preferably, the laser beam used at step (c) includes a plurality of laser beams that overlap each other to generate the interference field.

As described above, in the methods of the first and the second aspects, on the photosensitive film is arranged the liquid with a refractive index higher than air or the water-soluble film equivalent to the liquid, as well as the laser interference exposure is performed under the condition. Arranging the liquid or the water-soluble film reduces refractive-index difference between the photosensitive film and media (the liquid and the parallel plate) in contact with the photosensitive film, as compared to when the interference field is directly input to the photosensitive film (namely, when the photosensitive film in contact with air is exposed to the light). This suppresses diffraction of the interference field caused by an uneven surface of the photosensitive film, thereby preventing disturbance of intensity distribution of the interference field in the photosensitive film. Accordingly, the methods of the above aspects can provide a method for producing a high-quality fine structure that ensures excellent exposure on an uneven surface.

In the method of the second aspect, at step (d), the photosensitive film may be developed after removing the water-soluble film. Alternatively, the photosensitive film can be developed without removing the water-soluble film. In other words, removing the water-soluble film before the development of the photosensitive film is not essential. When developing the photosensitive film while leaving the water-soluble film unremoved, the water-soluble film can be dissolved simultaneously with formation of a pattern on the photosensitive film.

Preferably, the method of the first aspect further includes forming the first convex portions on the at least one surface of the substrate before step (a). In this case, for example, "the first convex portions" serve to diffract incident light. In this manner, forming the second convex portions finer than the first convex portions after forming the first convex portions can ensure excellent exposure.

Preferably, the method of the first aspect further includes removing the photosensitive film pattern after etching the substrate. When the photosensitive film pattern is unremoved, the present step is not needed. The photosensitive film pattern can be removed when the pattern finally becomes unnecessary.

Preferably, the method of the first aspect further includes forming a reflection preventing film on a surface of the parallel plate where the laser beams are input. Arranging the reflection preventing film suppresses reflected light occurring at a boundary between an air layer and the parallel plate, so that exposure unevenness can be further reduced.

According to a third aspect of the invention, there is provided a method for producing a fine structure. The method includes (a) forming a metal film to cover a plurality of first convex portions formed in at least one surface of a substrate; (b) forming a first reflection preventing film to cover the metal film on the at least one surface of the substrate; (c) forming a photosensitive film to cover the first reflection preventing film above the substrate; (d) arranging liquid to cover the photosensitive film above the substrate; (e) arranging a transparent parallel plate such that the parallel plate opposes the substrate via the liquid; (f) generating interference field by using a laser beam to irradiate the interference field onto the photosensitive film via the parallel plate and the liquid; (g) removing the liquid and the parallel plate to develop the photosensitive film so as to form a photosensitive film pattern; and (h) etching the metal film and the first reflection preventing film using a mask of the photosensitive film pattern to form a plurality of fine convex portions smaller than the first convex portions on the at least one surface of the substrate. In the method, the liquid arranged at step (d) has a refractive index larger than 1 and equal to or smaller than a refractive index of the photosensitive film.

In the method of the third aspect, preferably, the laser beam used at step (f) includes a plurality of laser beams that are intersected to generate the interference field. Alternatively, preferably, the parallel plate arranged at step (e) has a diffraction grating, and the laser beam used at step (f) is a single laser beam that is input to the diffraction grating to generate the interference field.

Additionally, preferably, the method above further includes forming a light-shielding layer having at least one opening on a surface of the parallel plate facing the liquid at step (e). In this case, the method may further include forming a plurality of openings as the at least one opening at step (e) and sequentially placing a shielding plate above the parallel plate to expose each of the openings so as to irradiate the interference field onto a plurality of regions on the at least one surface of the substrate at step (f). Alternatively, the method may further include forming a single opening as the at least one opening at step (e) and moving the parallel plate to irradiate the interference field onto a plurality of regions on the at least one surface of the substrate at step (f).

According to a fourth aspect of the invention, there is provided a method for producing a fine structure. The method includes (a) forming a metal film to cover a plurality of first convex portions on at least one surface of a substrate; (b) forming a first reflection preventing film to cover the metal film on the at least one surface of the substrate; (c) forming a photosensitive film to cover the first reflection preventing film above the substrate; (d) forming a water-soluble film to cover the photosensitive film above the substrate; (e) generating interference field by using a laser beam to irradiate the interference field onto the photosensitive film via the water-soluble film; (f) developing the photosensitive film to form a photosensitive film pattern; and (g) etching the metal film and the first reflection preventing film using a mask of the photosensitive film pattern to form a plurality of fine convex portions smaller than the first convex portions on the at least one surface of the substrate. In the method, the water-soluble film formed at step (d) has a refractive index larger than 1 and equal to or smaller than a refractive index of the photosensitive film.

In the method of the fourth aspect, preferably, the laser beam used at step (e) includes a plurality of laser beams that are intersected to generate the interference field.

As described above, in the methods of the third and the fourth aspects, on the photosensitive film is arranged the liquid having a higher refractive index than that of air or the water-soluble film equivalent to the liquid, and under the condition, the laser interference exposure is performed. Arranging the liquid or the water-soluble film reduces refractive-index difference between the photosensitive film and media in contact with the photosensitive film (the liquid and the parallel plate), as compared to when the interference field is directly input to the photosensitive film (namely, when the photosensitive film in contact with air is exposed to the light). This suppresses diffraction of the interference field caused by an uneven surface of the photosensitive film, thereby preventing disturbance of intensity distribution of the interference field in the photosensitive film. Accordingly, the method of the present embodiment can produce a high-quality fine structure that achieves excellent exposure on an uneven surface.

In the method of the fourth aspect, preferably, at step (f), the photosensitive film is developed after removing the water-soluble film. Alternatively, the photosensitive film can be developed without removing the water-soluble film. In other words, removing the water-soluble film before developing the photosensitive film is not essential. When the photosensitive film is developed while leaving the water-soluble film unremoved, the water-soluble film can be dissolved simultaneously with formation of a pattern on the photosensitive film.

Preferably, the method of the third aspect further includes forming the first convex portions on the at least one surface of the substrate before step (a). In this case, "the first convex portions" serve to diffract incident light, for example. Thus, excellent exposure can be ensured by forming second convex portions finer than the first convex portions after forming the first convex portions.

Preferably, the method of the third aspect further includes removing the photosensitive film pattern after etching the metal film and the first reflection preventing film. When the photosensitive film pattern is unremoved, the present step is not needed. The photosensitive film pattern can be removed when the pattern finally becomes unnecessary.

Preferably, the above method further includes removing the first reflection preventing film after removing the photosensitive film pattern. The first reflection preventing film can be removed when the film finally becomes unnecessary.

The above step is not needed when the first reflection preventing film is unremoved. This can simplify production steps.

Preferably, the method of the third aspect further includes forming a second reflection preventing film on a surface of the parallel plate where the laser beams are input. This suppresses reflected light occurring at a boundary between an air layer and the parallel plate, thereby enabling exposure unevenness to be further reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described with reference to the drawings. In the respective drawings, constituent elements are shown in a recognizable size by allowing dimensions and proportions of the constituent elements to be different from actual ones thereof according to needs.

First Embodiment

Figure 1:
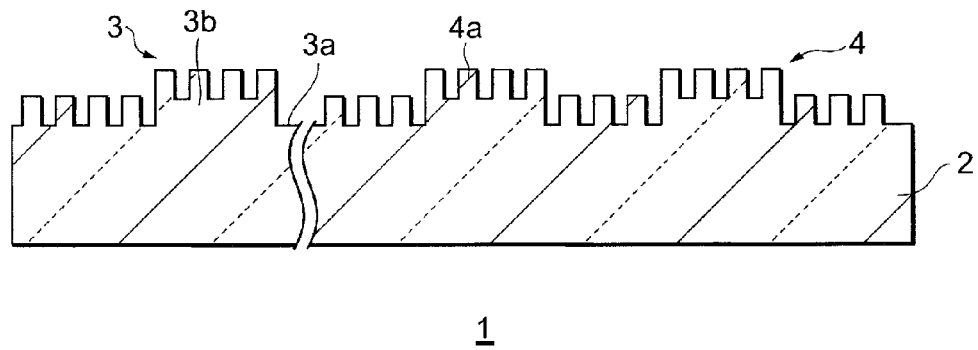
FIG. 1 is a schematic view showing a cross-sectional configuration of an optical element produced by a method according to a first embodiment of the invention.

FIG. 1 schematically depicts a cross-sectional configuration of a diffractive optical element as an example of a fine structure according to a first embodiment of the invention. A diffractive optical element (an optical element) 1 of the first embodiment shown in FIG. 1 includes a substrate 2, a diffractive structural section 3, and a grid section (a non-diffractive structural section) 4.

The substrate 2 is transparent to a wavelength of incident light. The substrate 2 may be made of an inorganic material such as glass (e.g. a fused silica substrate). For example, the substrate 2 has a thickness of approximately 1.2 mm. The diffractive structural section 3 is provided on one (a first surface) of major surfaces of the substrate 2. The other one of the major surfaces of the substrate 2 is a flat surface.

The diffractive structural section 3 on the first surface of the substrate 2 includes a plurality of concave portions 3a and a plurality of convex portions 3b that are alternately arranged. In FIG. 1, for convenience of understanding, respective single ones of the concave and the convex portions 3a and 3b are given reference numerals. As shown in the drawing, the diffractive structural section 3 including the concave and the convex portions 3a and 3b has a rectangular cross-sectional configuration, but alternatively, may have a more or less tapered configuration. In addition, the diffractive structural section 3 in the present embodiment is formed by processing the first surface of the substrate 2. In short, the substrate 2 and the diffractive structural section 3 are integrally formed with each other.

The grid section 4 is provided along the first surface of the substrate 2, namely, along an upper surface of the diffractive structural section 3. The grid section 4 in the embodiment is integrally formed with the substrate 2 and the diffractive structural section 3. The grid section 4 includes a plurality of fine convex portions 4a smaller than the convex portions 3b of the diffractive structural section 3. The fine convex portions 4a are made of a dielectric material. In the embodiment, the fine convex portions 4a are made of fused silica glass.

Figure 2A:
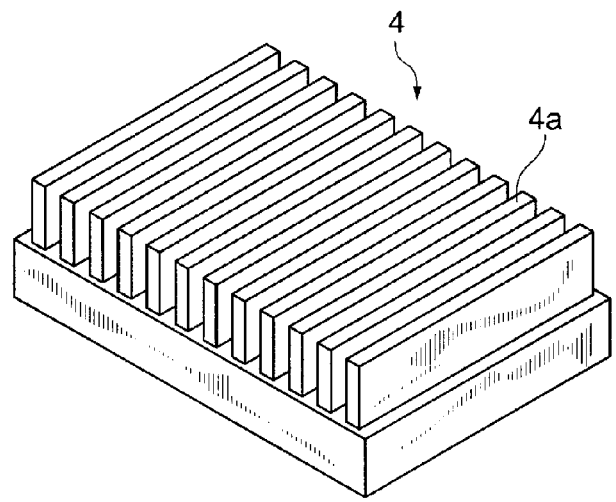
FIGS. 2A and 2B are schematic perspective views each showing an enlarged part of an example of a grid section.
Figure 2B:
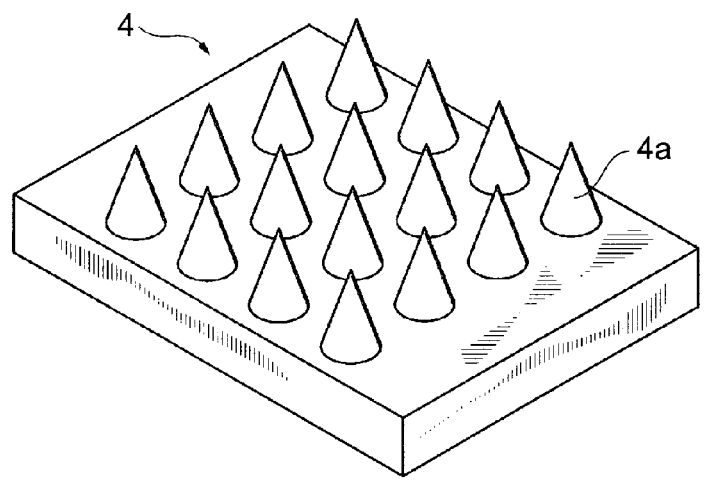

FIGS. 2A and 2B are schematic perspective views, each of which shows an enlarged part of the grid section 4. As shown in an example of FIG. 2A, the fine convex portions 4a of the grid section 4 each have a fringed shape and are extended in a single direction (a Y-axis direction in the drawing). The fine convex portions 4a are cyclically arranged in an X-axis direction, for example. An arrangement of the fine convex portions 4a is not restricted to a one-dimensional grid array as in FIG. 2A and may be a matrix array (a two-dimensional grid array), for example, as shown in FIG. 2B. In this case, a distance between the fine convex portions 4a may be or may not be constant. FIG. 2B shows an example of the fine convex portions 4a having a conical shape, although the shape of the fine convex portions 4a is not restricted to that and can be any other shape such as a semicircle, a pyramid, or a pillar.

Figure 3A:
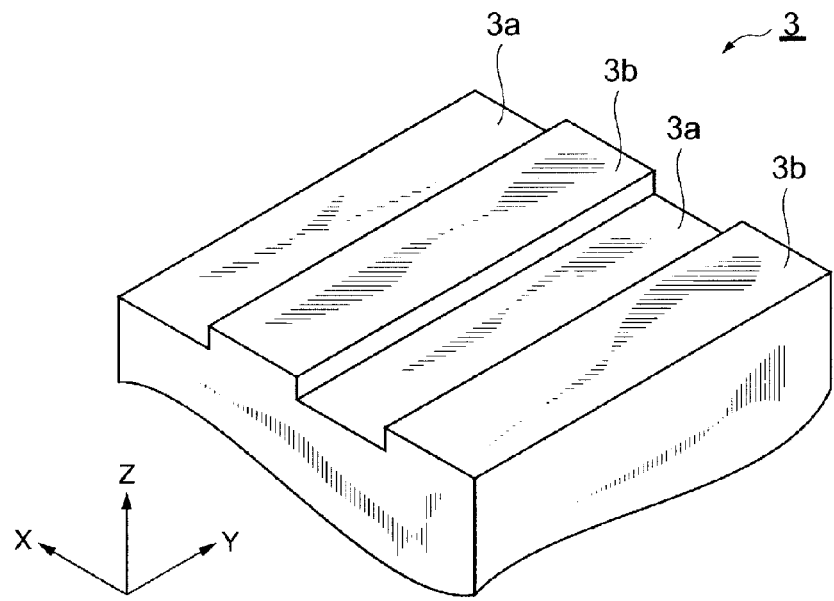
FIGS. 3A and 3B are schematic perspective views each showing an enlarged part of an example of a diffractive structural section.
Figure 3B:
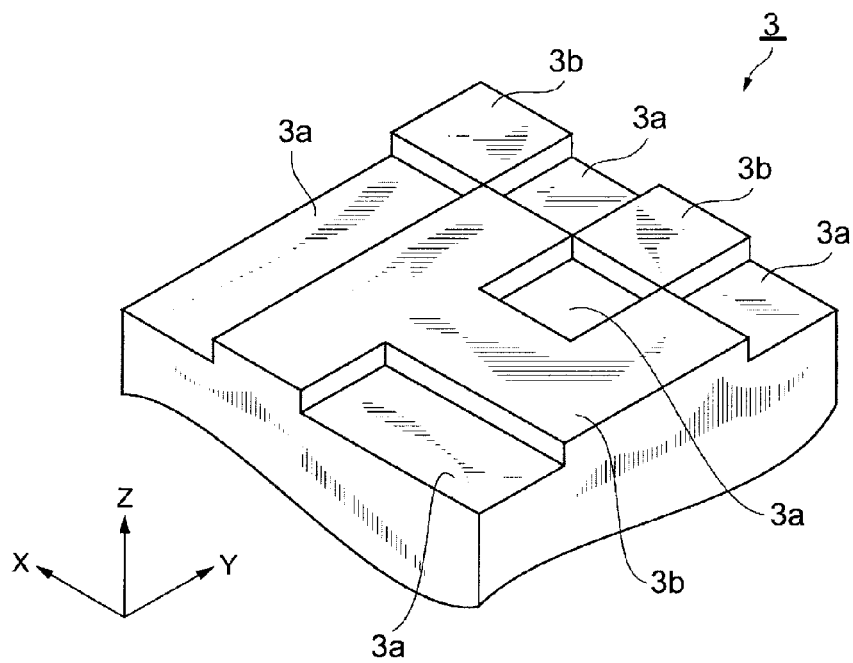

FIGS. 3A and 3B are schematic perspective views, each of which shows an enlarged part of the diffractive structural section 3. In an example of FIG. 3A, the diffractive structural section 3 includes the concave portions 3a and the convex portions 3b extended in a single direction (a Y-axis direction in FIG. 3A). As shown in the drawing, the concave and the convex portions 3a and 3b each have a fringed shape and are cyclically arranged in an X-axis direction. The concave and the convex portions 3a and 3b may not necessarily be arranged as a one-dimensional array (a one-dimensional grid) shown in FIG. 3A, and, for example, may be two-dimensionally arranged (a two-dimensional grid) as shown in FIG. 3B.

Figure 4A:
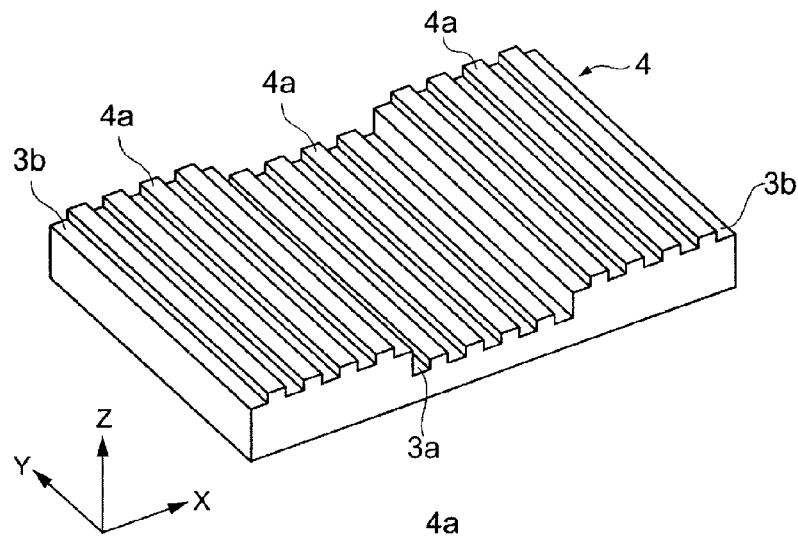
FIGS. 4A to 4C are schematic perspective views each showing a partially enlarged view of the diffractive structural section and the grid section.
Figure 4B:
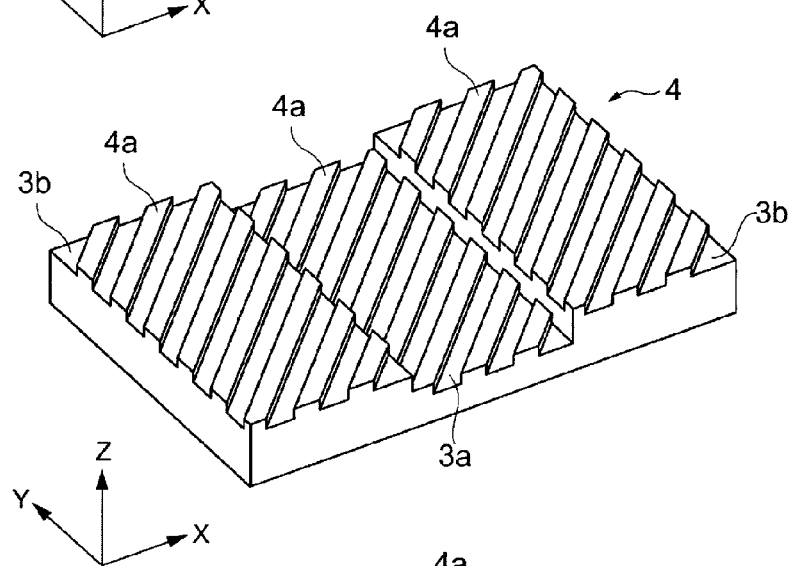
Figure 4C:
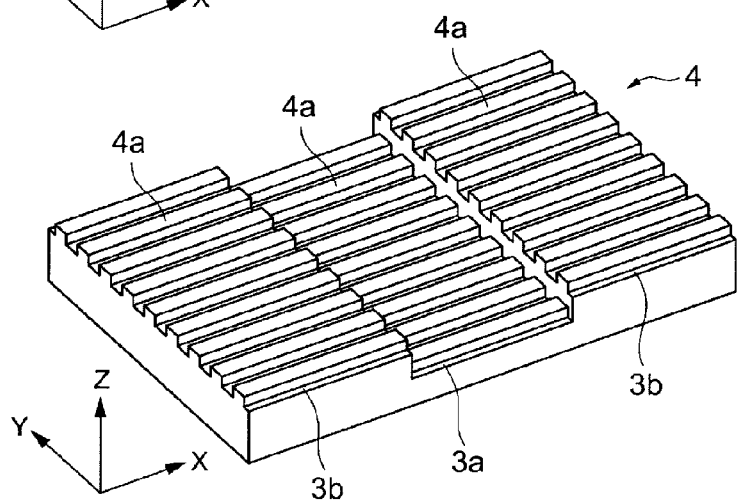

FIGS. 4A to 4C are schematic perspective views each showing an enlarged view of the diffractive structural section 3 and the grid section 4. With reference to the drawings, a description will be given of a preferable relative arrangement between the diffractive structural section 3 and the grid section 4 in a one-dimensional grid made of the fine convex portions 4a of the grid section 4. The relative arrangement between the diffractive structural section 3 and the grid section 4 can be set as in an example of FIG. 4A. Specifically, in FIG. 4A, the concave portions 3a and the convex portions 3b of the diffractive structural section 3 are extended in a Y-axis direction of the drawing and are alternately arranged in an X-axis direction thereof, as well as the fine convex portions 4a of the grid section 4 are also arranged in the same manner. In other words, an extending direction of the concave and the convex portions 3a and 3b is parallel to an extending direction of the fine convex portions 4a.

Additionally, when the diffractive structural section 3 and the grid section 4 are arranged relatively with each other, preferably, the extending direction of the concave and the convex portions 3a and 3b is intersected with the extending direction of the fine convex portions 4a at a predetermined angle, as shown in FIGS. 4B and 4C. Specifically, in an example of FIG. 4B, the concave and the convex portions 3a and 3b of the diffractive structural section 3 are extended in the Y-axis direction of the drawing and are alternately arranged in the X-axis direction thereof. In contrast, the fine convex portions 4a of the grid section 4 are extended in a direction intersecting with the Y-axis direction at an angle of approximately 45 degrees and are alternately arranged in a direction orthogonal to the intersecting direction.

In an example of FIG. 4C, the concave and the convex portions 3a and 3b of the diffractive structural section 3 are extended in the Y-axis direction of the drawing and are alternately arranged in the X-axis direction. In contrast, the fine convex portions 4a of the grid section 4 are extended in a direction intersecting with the Y-axis direction of the drawing at an angle of approximately 90 degrees (namely, in the X-axis direction) and are alternately arranged in a direction orthogonal to the intersecting direction (namely, in the Y-axis direction). In this manner, allowing the concave and the convex portions 3a and 3b to intersect with the fine convex portions 4a further facilitates formation of the fine convex portions 4a near stepped portions between the concave portions 3a and the convex portions 3b. An intersecting angle of the extending direction of the concave and the convex portions 3a and 3b with the extending direction of the fine convex portions 4a can be determined according to needs. The angles of 45 and 90 degrees shown as the above examples are preferable intersecting angles because those angles are often used in optical systems in general.

Figure 5:
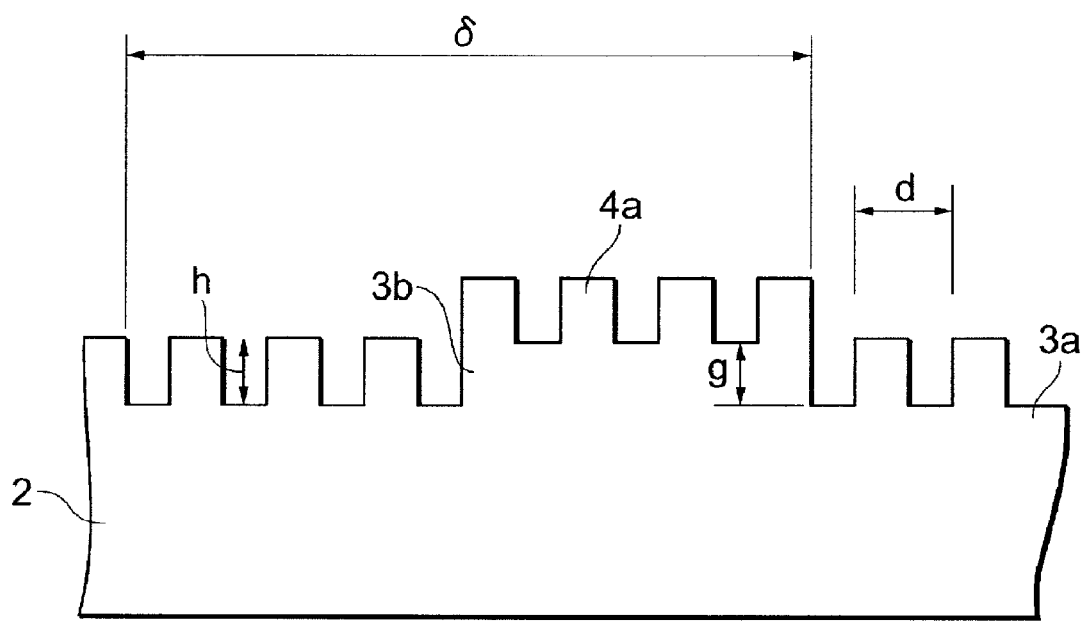
FIG. 5 is a schematic cross-sectional view showing enlarged parts of the diffractive structural section and the grid section.

FIG. 5 is a schematic cross-sectional view showing enlarged parts of the diffractive structural section 3 and the grid section 4. For convenience of description, hatching is omitted. With reference to FIG. 5, a further detailed description will be given of structures of the diffractive structural section 3 and the grid section 4. As shown in the drawing, δ (nm) represents a distance between the convex portions 3b of the diffractive structural section 3 (a cycle of a concave and convex portion); d (nm) represents a distance between the fine convex portions 4a of the grid section 4 (a grid cycle); and λ (nm) represents a wavelength of incident light. In the diffractive optical element 1 of the present embodiment, a relationship between the wavelength λ of the incident light and the diffractive structure and the grid structure is obtained by following expressions:

$$d < \lambda \text{ and } \lambda < \delta \quad (1)$$

When considering a case in which the diffractive optical element 1 is used in a visible-light wavelength range, the distances δ and d, respectively, can be determined to be 5.0 μm and 300 nm, for example. In other words, the grid cycle d only needs to be approximately equal to or smaller than a half of the wavelength λ of incident light. Additionally, δ as the cycle of the concave and convex structure only needs to be approximately a few times to 10 times the wavelength λ of incident light. Satisfying these relationships allows the fine convex portions 4a to be formed smaller than the convex portions 3b.

Additionally, in a relationship between the cycle d and a depth h of the grid section 4 and the wavelength λ, for example, the cycle d and the depth h can be determined by following expressions (2):

$$d = 0.55\lambda \text{ and } h = 0.207\lambda \quad (2)$$

Forming the grid section 4 under the above conditions enables reflected light to be almost inhibited by the grid section 4. For example, when λ is 532 nm, d is 293 nm and h is 110 nm.

Meanwhile, a preferable depth g of the concave and convex structure (a stepped portion between the concave and the convex portions 3a and 3b) can be determined by a following expression (3):

$$g = \lambda/2(n-1) \quad (3)$$

In the above expression, n represents a refractive index of material of the diffractive structural section 3. The above expression (3) indicates that there is a depth appropriate with respect to the wavelength λ. For example, when λ is 532 nm and n is 1.46, g is 578 nm.

The diffractive optical element 1 of the embodiment is structured as described above. Next will be described a method for producing the diffractive optical element 1.

FIGS. 6A to 6D and FIGS. 7A and 7B are schematic step views showing an example of the method for producing the diffractive optical element (a fine structure). In each of the drawings, there is shown an enlarged part of a cross-sectional configuration of the diffractive optical element 1.

Figure 6A:
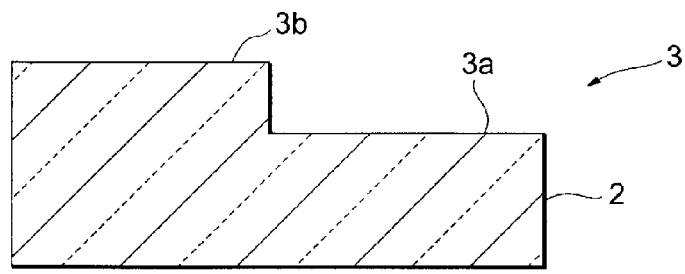
FIGS. 6A to 6D are schematic cross-sectional views illustrating the method for producing the diffractive optical element (a fine structure) according to the first embodiment.

At a first step, on the first surface of the substrate 2 is formed the diffractive structural section 3 including the concave portions 3a and the convex portions 3b (FIG. 6A). The step can be performed by using well-known techniques such as photolithography and etching. Specifically, first, a photosensitive film such as a resist film (not shown) is formed in the first surface of the substrate 2. Then, exposure of the photosensitive film is performed using an exposure mask having an exposure pattern corresponding to the concave and convex portions 3a and 3b, and then the photosensitive film is developed. After that, dry etching or wet etching is performed using the developed photosensitive film as an etching mask. Thereby, based on the pattern of the exposure mask, a predetermined concave and convex configuration is formed in the first surface of the substrate 2. The substrate 2 may be made of fused silica glass as described above and may be, for example, 1.2 mm in thickness. The stepped portion between the concave and the convex portions 3a and 3b (namely, the depth of the diffractive structural section 3) is 578 nm, for example, as described above. The depth g is controlled by an etching time or the like.

Figure 6B:
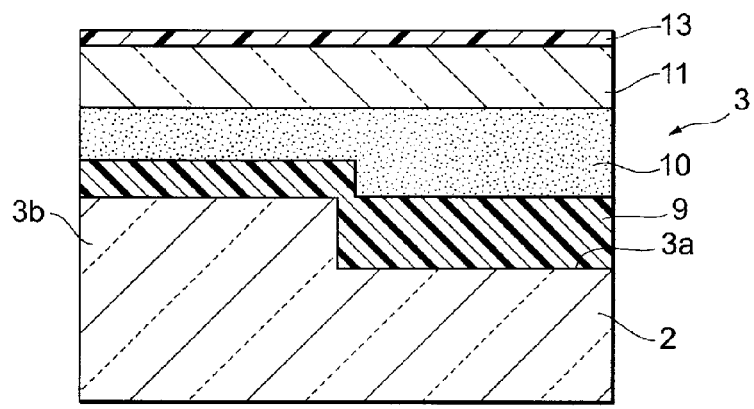

Next, on the first surface of the substrate 2 is formed a photosensitive film 9 to cover the diffractive structural section 3 (FIG. 6B). For example, the photosensitive film 9 is a negative- or positive-type resist film and can be formed by spin coating. A thickness of the photosensitive film 9 can be determined according to need, but is desirably determined so as to entirely cover a region overlapping with at least the concave and the convex portions 3a and 3b and also so as to allow film surfaces to be almost flattened. However, due to influence of the concave and the convex portions 3a and 3b located under the photosensitive film 9, flatness of the surfaces of the photosensitive film 9 can be reduced as shown in the drawing.

Next, a liquid (a liquid film) 10 having a high refractive index is formed to cover the photosensitive film 9. A transparent parallel plate (a substrate) 11 is arranged such that the parallel plate opposes the substrate 2 (FIG. 6B) via the liquid 10. Arranging the liquid 10 between the parallel plate 11 and the substrate 2 allows the liquid 10 to be retained on the photosensitive film 9 as shown in the drawing. Desirably, at least a surface of the parallel plate 11 contacting with the liquid 10 has a high level of flatness, such as a few nanometer flatness. The parallel plate 11 may be formed of a fused silica glass substrate. Additionally, as shown in the drawing, preferably, the parallel plate 11 has a reflection preventing film 13 on a surface of the plate where a plurality of laser beams described below are input. The anti-reflection film 13 may be a dielectric multilayer film or the like.

The liquid 10 has a refractive index larger than 1 (namely, larger than a refractive index of air) and equal to (equivalent to) or smaller than the refractive index of the photosensitive film 9. For example, the liquid 10 may be liquid with a high refractive index used for immersion lithography in production of a semiconductor device. In this case, the refractive index of the liquid 10 is, for example, approximately 1.53. The photosensitive film 9 and the parallel plate 11, respectively, may have a refractive index of approximately 1.70 and a refractive index of approximately 1.50, respectively, for example. The refractive index of the liquid 10 is desirably closer to the refractive index of the photosensitive film 9. The respective refractive indexes exemplified above are values at a wavelength (266 nm) from a laser light source described below.

Figure 6C:
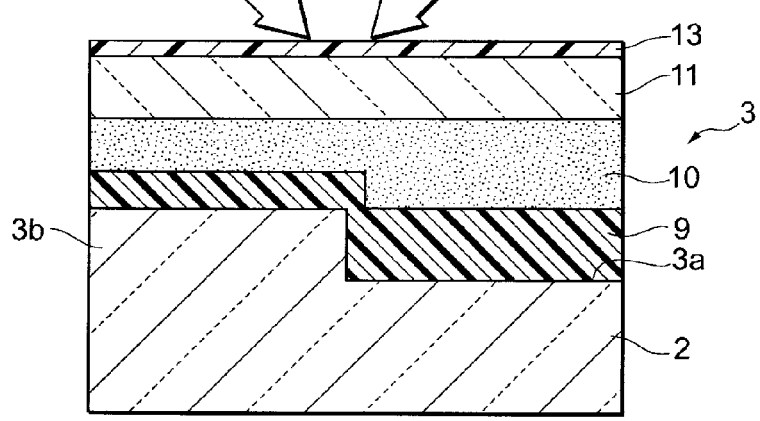

Next, via the liquid 10 and the parallel plate 11, laser interference exposure is performed into the photosensitive film 9 formed in the first surface of the substrate 2 (FIG. 6C). An example of the light source used for the laser interference exposure may be a continuous-wave DUV (deep ultra violet) laser operating at the 266-nm wavelength. A laser beam output from the laser is split into two laser beams L1 and L2 as appropriate to allow the beams to intersect with each other at a predetermined angle as shown in the drawing. This generates light (interference field) including interference fringes of cyclical bright and dark domains. A pitch between the interference fringes (a cycle of the bright domain and the dark domain) is determined based on the above intersecting angle. Determining the intersecting angle as appropriate allows the pitch between the interference fringes to be set to 293 nm. Then, the interference field thus generated is thrown to the photosensitive film 9, whereby a latent image pattern corresponding to the pitch between the interference fringes is formed in the photosensitive film 9. When the reflection preventing film 13 is provided on the parallel plate 11 as described above, the film suppresses reflected light generated at a boundary between an air layer and the parallel plate 11, so that exposure unevenness can be further reduced. Depending on precision or the like required for the diffractive optical element 1 as the fine structure, the exposure unevenness may be permitted to some extent. Additionally, depending on a balance among the refractive indexes of the parallel plate 11, the liquid 10, and the photosensitive film 9, it may be possible to suppress reflected light at the boundary between the air layer and the parallel plate 11 to a practically acceptable extent. Therefore, it is not essential to provide the reflection preventing film 13 on the parallel plate 11.

Next, the photosensitive film 9 having the latent image pattern formed by the interference field is developed (FIG. 6D) to form a photosensitive film pattern 9a as a cyclical pattern corresponding to the pitch between the interference fringes, as in the drawing. For example, when the pitch between the interference fringes is 293 nm, a cycle of the photosensitive film pattern 9a is also approximately the same as the pitch.

Figure 7A:
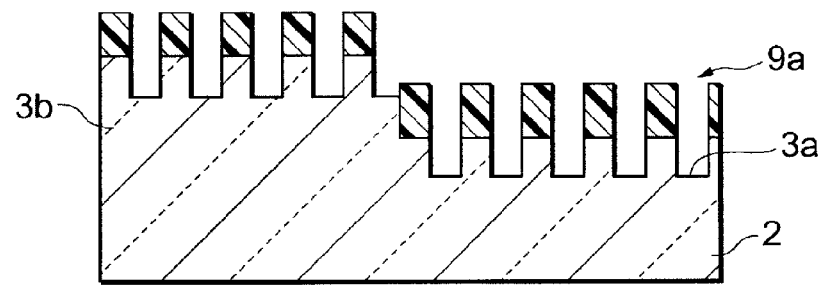
FIGS. 7A and 7B are also schematic cross-sectional views illustrating the method for producing the diffractive optical element (the fine structure) according to the first embodiment.

Next, etching such as dry etching is performed using a mask of the photosensitive film pattern 9a (FIG. 7A). Thereby, as in the drawing, an image of the photosensitive film pattern 9a is transferred onto the substrate 2, and then, the photosensitive film pattern 9a is removed (FIG. 7B), whereby the grid section 4 (the fine convex portions 4a) is formed along surfaces of the concave and the convex portions 3a and 3b of the diffractive structural section 3 on the first surface of the substrate 2, as shown in the drawing.

The above drawings illustrate the method for producing the diffractive optical element including the one-dimensional grid section 4. However, in the laser interference exposure of FIG. 6C, a position of the first surface of the substrate 2 relative to the interference field is rotated by 90 degrees to perform exposure twice to form a latent image pattern of a two-dimensional grid shape. Then, performing etching using the latent image pattern allows the grid section 4 to be formed into a two-dimensional grid array.

Next will be described a method according to a modification of the embodiment. In the method of the first embodiment, the interference field is generated by intersecting the multiple laser beams. However, using a diffraction grating allows the interference field to be generated by a single laser beam.

FIGS. 8A to 8D are schematic step views illustrating a method for producing a diffractive optical element (a fine structure) according to a first modification of the first embodiment. The step views correspond to those shown in FIGS. 6A to 6D.

Figure 8A:
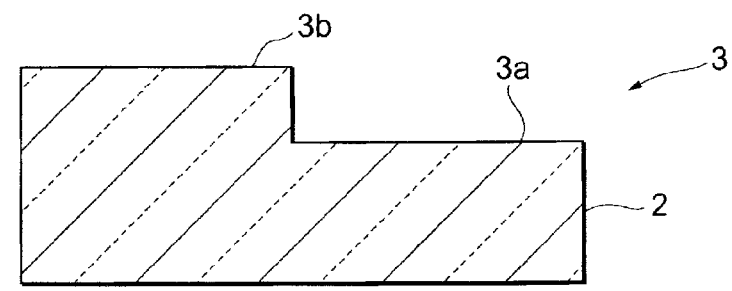
FIGS. 8A to 8D are schematic cross-sectional views illustrating an example of a method for producing a diffractive optical element (a fine structure) according to a first modification of the first embodiment.
Figure 8B:
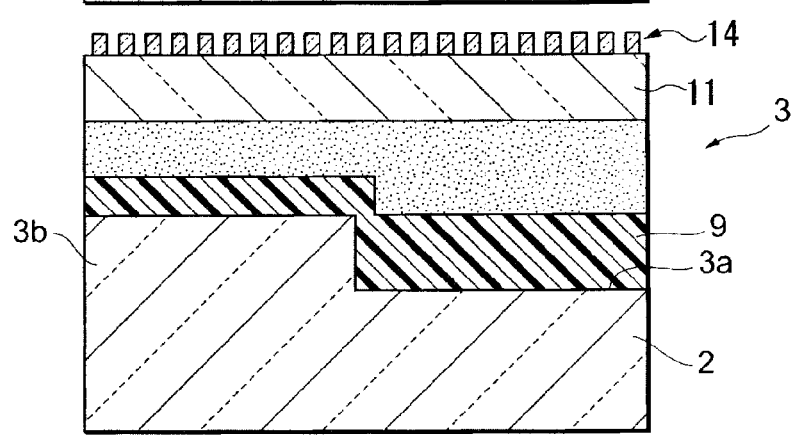

As in the method described above, on the first surface of the substrate 2 is formed the diffractive structural section 3 including the concave portions 3a and the convex portions 3b (FIG. 8A). Then, the photosensitive film 9 is formed in the first surface thereof to cover the diffractive structural section 3 (FIG. 8B).

Next, similarly to the above method, the liquid (the liquid film) 10 having a high refractive index is formed to cover the photosensitive film 9. The parallel plate (the substrate) 11 is arranged such that the parallel plate opposes the substrate 2 via the liquid 10 (FIG. 8B). In the present modification, a diffraction grating 14 described below is formed in the surface of the parallel plate 11 where a laser beam is input.

Figure 8C:
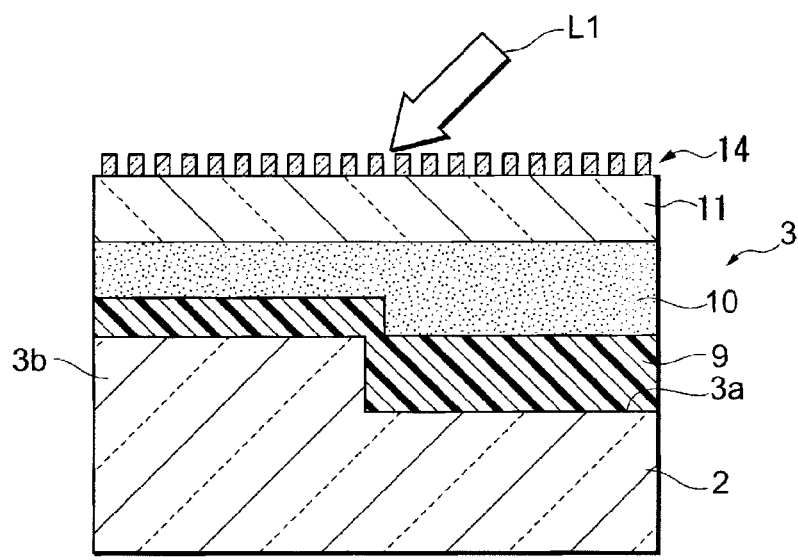

Next, via the liquid 10 and the parallel plate 11, laser interference exposure is performed into the photosensitive film 9 formed in the first surface of the substrate 2 (FIG. 8C). A light source for the laser interference exposure is the same as the laser used in the above-described method, whereby the laser beam L1 as a single beam output from the laser is input to the diffraction grating 14 at a predetermined angle. Thereby, light (the interference field) including interference fringes of cyclical bright and dark domains is generated and thrown to the photosensitive film 9. This allows a latent image pattern corresponding to a pitch between the interference fringes to be formed in the photosensitive film 9, as in the method of the first embodiment.

Figure 8D:
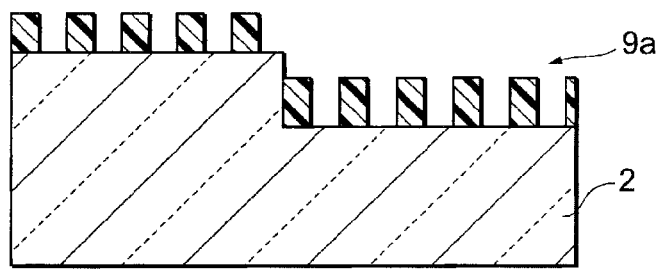

Next, similarly to the method, there is developed the photosensitive film 9 with the latent image pattern formed by the interference field (FIG. 8D). As a result, the photosensitive film pattern 9a is formed that has a cycle corresponding to the pitch between the interference fringes, as shown in the drawing.

Figure 7B:
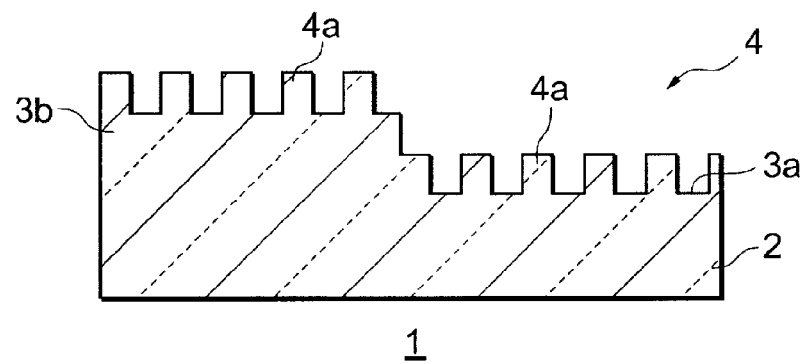

Then, similarly, using a mask of the photosensitive film pattern 9a, etching is performed, followed by removal of the photosensitive film pattern 9a (FIGS. 7A and 7B). Thereby, as in the method of the first embodiment, on the first surface of the substrate 2 is formed the grid section 4 (the fine convex portions 4a) along the surfaces of the concave and the convex portions 3a and 3b of the diffractive structural section 3.

Figure 9A:
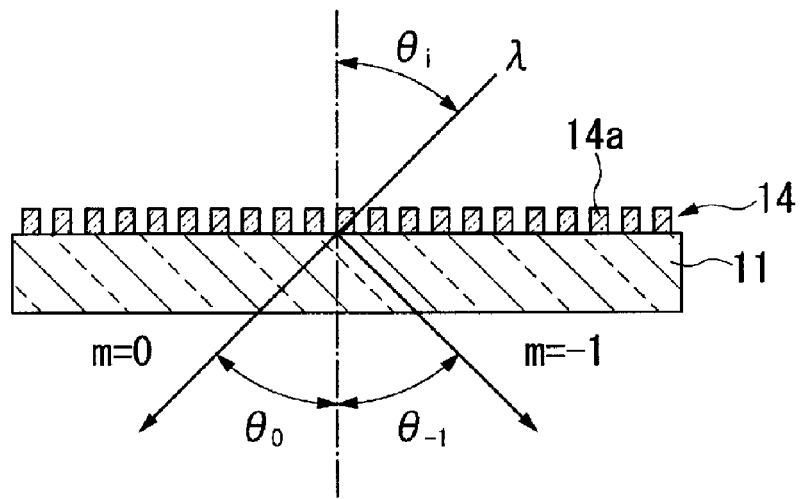
FIGS. 9A and 9B are enlarged views of a parallel plate and a diffraction grating.
Figure 9B:
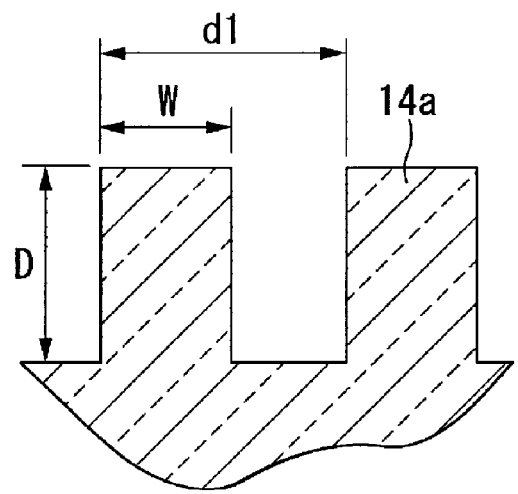

FIGS. 9A and 9B are a schematic cross-sectional view of the parallel plate 11 and an enlarged view of the diffraction grating 14.

To form convex portions 14a of the diffraction grating 14, on the first surface of the parallel plate 11 made of fused silica or the like is first formed a photosensitive film such as a resist film (not shown). Next, exposure of the photosensitive film is performed using an exposure mask of an exposure pattern corresponding to the convex portions 14a, and then, the exposed photosensitive film is developed. After that, dry or wet etching is performed with the developed photosensitive film as an etching mask. Thereby, on the first surface of the parallel plate 11 are formed predetermined concave and convex portions corresponding to the pattern of the exposure mask.

As shown in the drawings, $\theta_i$ represents an incident angle of the laser beam, m represents a diffraction order; $\lambda$ represents a wavelength of the incident light; and d1 (nm) represents a distance between the convex portions 14a of the diffraction grating 14 (a cycle of a concave and convex portion). In the diffraction grating 14 of the present modification, a relationship between the incident angle of and the wavelength of the incident light and the diffraction structure is obtained by a following expression (4):

$$\sin \theta_i = m\lambda/(2d1) \tag{4}$$

For example, when a laser beam with the wavelength $\lambda$ of 266 nm is input to the diffraction grating 14 having a distance d1 of 140 nm and a width W of 70 nm to perform exposure using 0-order diffracted light and −1-order diffracted light, the incident angle $\theta_i$ is 71.8 degrees where the diffraction order m is −1. In this case, a diffraction angle $\theta_0$ of the 0-order diffracted light and a diffraction angle $\theta_{-1}$ of the −1-order diffracted light are both 71.8 degrees. The pitch between interference fringes (a cycle of bright and dark domains) formed by the 0-order diffracted light and the −1-order diffracted light is 140 nm. In short, the formed interference fringes are the same as the interference fringes obtained by intersecting the two laser beams.

Intensities of the 0-order diffracted light and the −1-order diffracted light can be adjusted by the depth D of the diffraction grating.

Figure 10:
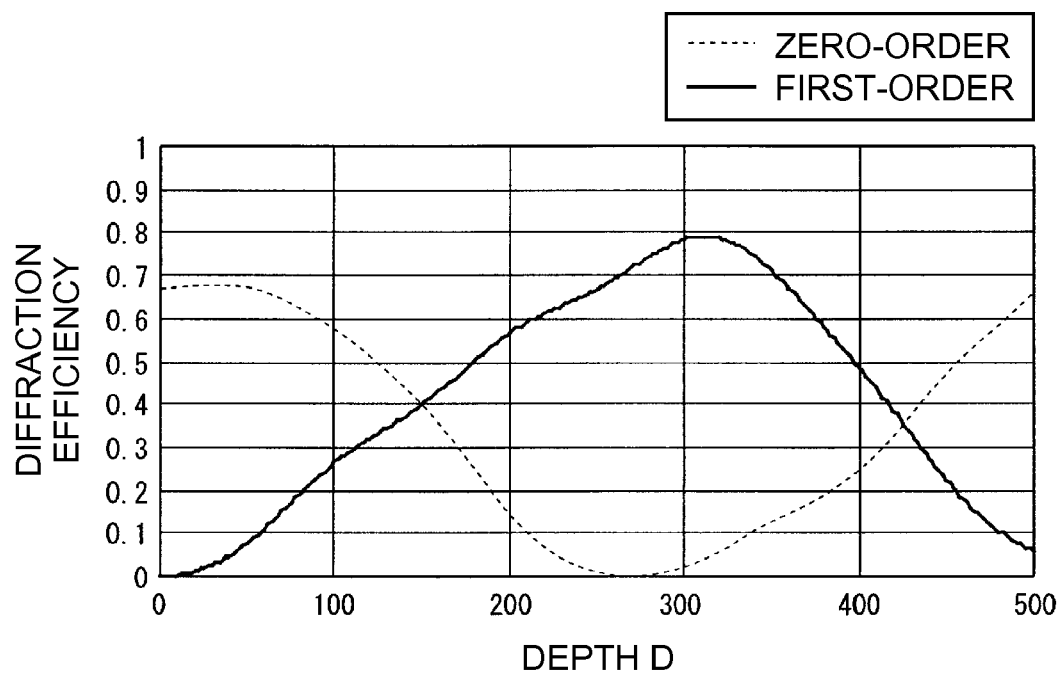
FIG. 10 is a graph showing a relationship between diffraction efficiency of diffracted light and depth of a diffraction grating.

FIG. 10 is a graph showing a relationship between diffraction efficiencies of the diffracted lights and the depths D of the diffraction grating 14, in which a vertical axis indicates the diffraction efficiencies of the 0-order diffracted light and the −1-order diffracted light and a horizontal axis indicates the depth D of the diffraction grating 14.

As shown in FIG. 10, using the diffraction grating 14 having a depth D of approximately 150 nm allows the intensities of the 0-order diffracted light and the −1-order diffracted light to be approximately equalized. Thus, allowing the depth D of the diffraction grating 14 to be set to approximately 150 nm can provide high-contrast interference fringes.

Figure 11:
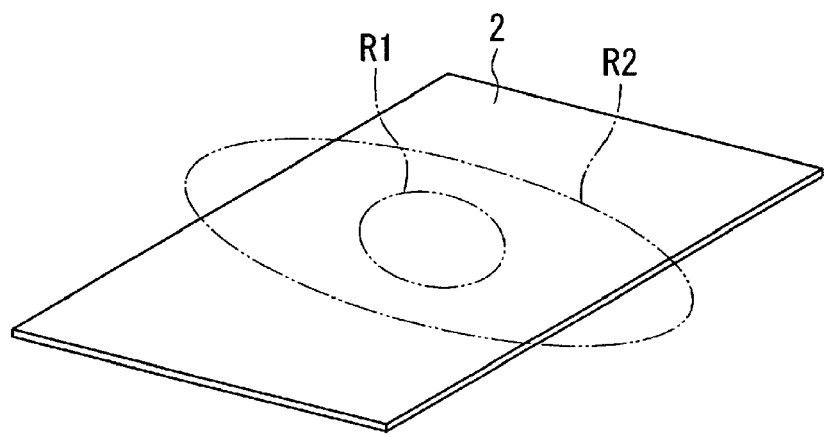
FIG. 11 is a schematic perspective view showing a region of a substrate where a laser beam is thrown.

FIG. 11 is a schematic perspective view showing a region of the substrate 2 where a laser beam is thrown.

The substrate 2 has, for example, dimensions of approximately 40 cm by approximately 50 cm, and a plurality of liquid crystal panels are to be formed in the substrate 2. An intensity of the laser beam exhibits a normal distribution on the substrate 2. Accordingly, as shown in FIG. 11, when the laser beam is thrown to a center of the substrate 2, there occur a region R1 having a relatively uniform beam intensity and a region R2 having a largely fluctuating beam intensity. Thus, the region R1 has high-contrast interference fringes, whereas the region R2 has a low-contrast interference fringes, so that an intended latent image pattern cannot be formed in the photosensitive film 9. Therefore, the laser beam needs to be shielded on the region R2 such that the laser beam is thrown only onto the region R1.

Figure 12A:
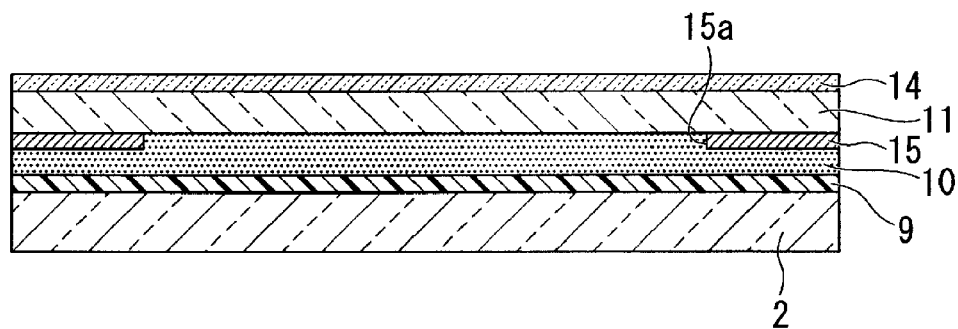
FIG. 12A is a cross-sectional view illustrating a method for producing a diffractive optical element (a fine structure) according to a second modification of the first embodiment.

FIG. 12A is a cross-sectional view showing a larger region of the parallel plate 11 by scaling down the view of FIG. 8B in which the parallel plate 11 opposes the substrate 2 via the liquid 10.

As shown in FIG. 12A, on a surface of the parallel plate 11 facing the liquid 10 is formed a light-shielding layer 15 made of a light-shielding material such as a metal. The light-shielding layer 15a includes an opening 15a corresponding to a size of a single liquid crystal panel. The opening 15a is formed by patterning of the light-shielding layer 15 using photolithography, etching, and the like. The opening 15a is formed to be smaller than the region R1 shown in FIG. 11.

When the parallel plate 11 has dimensions equal to or smaller than those of the substrate 2, preferably, the opening 15a includes a plurality of openings. For the parallel plate 11 sufficiently larger than the substrate 2, the opening 15a may be a single opening.

Figure 12B:
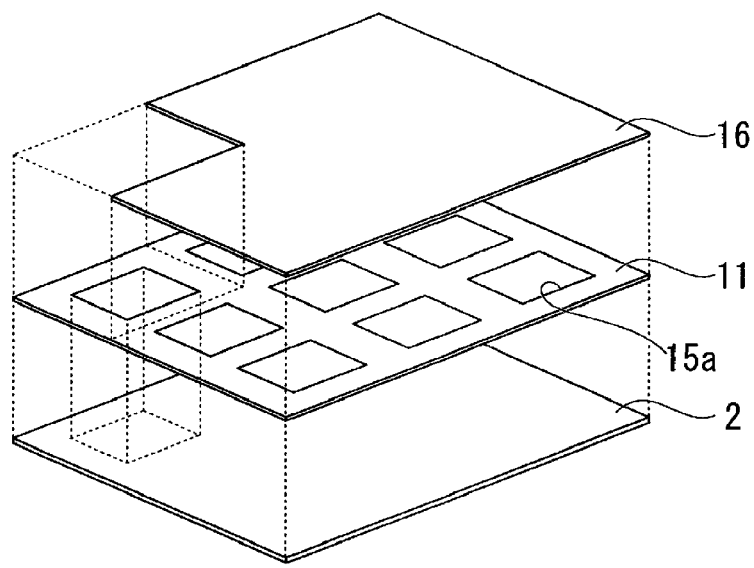
FIGS. 12B and 12C are schematic perspective views showing examples of the method shown in FIG. 12A.

FIG. 12B is an exploded perspective view showing a structure in which the openings 15a are formed in the parallel plate 11 shown in FIG. 12A.

As shown in FIG. 12B, on a surface of the parallel plate 11 where the laser beam is input, there is placed a shielding plate 16 to expose each of the openings 15a. As shown in FIG. 8C, when the laser beam L1 is thrown onto the parallel plate 11 with the diffraction grating 14, the region R1 having the uniform beam intensity is positioned so as to overlap with the opening 15a exposed from the shielding plate 16, as shown in FIG. 12B. This allows the laser beam on the region R2 showing the large beam-intensity fluctuation to be shielded by the light-shielding layer 15 and the shielding plate 16, so that high-contrast interference fringes can be obtained, thereby enabling the latent image pattern of the photosensitive film 9 to be uniformly formed in the substrate.

Next, another opening 15a is exposed by rotating the shielding plate 16 or by using another shielding plate to similarly irradiate the laser beam L1. In this manner, sequentially exposing each of the openings 15a and irradiating the laser beam L1 enables the latent image pattern of the photosensitive film 9 to be uniformly formed in a plurality of regions of the substrate 2 where the liquid crystal panels are to be formed.

Figure 12C:
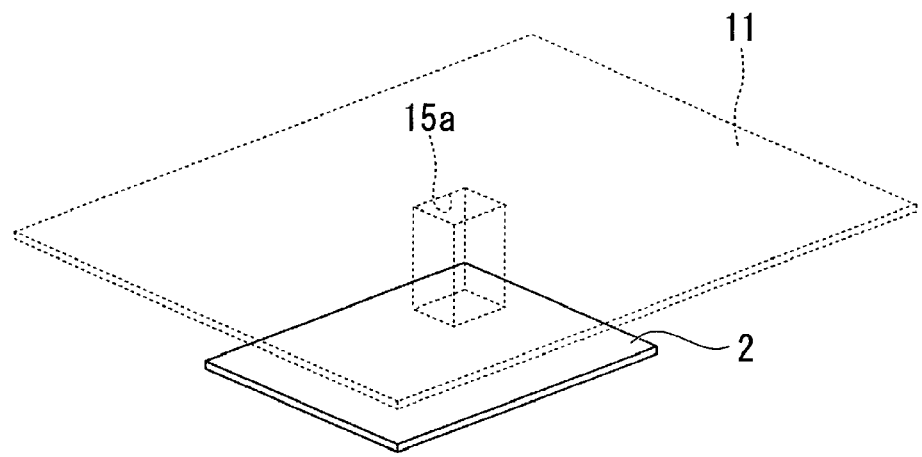

FIG. 12C is an exploded perspective view showing a structure in which the single opening 15a is formed in the parallel plate 11 shown in FIG. 12A.

As shown in FIG. 12C, the parallel plate 11 has a sufficiently large size relative to the substrate 2. In other words, the parallel plate 11 is formed such that the light-shielding layer 15 formed in the parallel plate 11 covers the substrate 2 except for a portion of the substrate exposed by the opening 15a in a state in which the opening 15a is shifted to a peripheral portion of the substrate 2.

Accordingly, the parallel plate 11 and the substrate 2 are moved relatively to each other to sequentially expose each of the forming regions of the liquid crystal panels from the opening 15a, whereby the laser beam L1 can be thrown such that the region R1 having the uniform beam intensity shown in FIG. 11 overlaps with each forming region of the panels. Consequently, since the light shielding layer 15 shields the laser beam on the region R2 having the large beam-intensity fluctuation, high-contrast interference fringes can be obtained. Thus, the latent image pattern of the photosensitive film 9 can be uniformly formed in the regions of the liquid crystal panels provided on the substrate 2.

Next will be described a method according to another modification of the first embodiment. The method of the first embodiment includes the liquid 10 that has a high refractive index and that is retained by the parallel plate 11. Using a water-soluble film with a high refractive index instead of the liquid 10 allows the parallel plate 11 to be omitted.

Figure 13A:
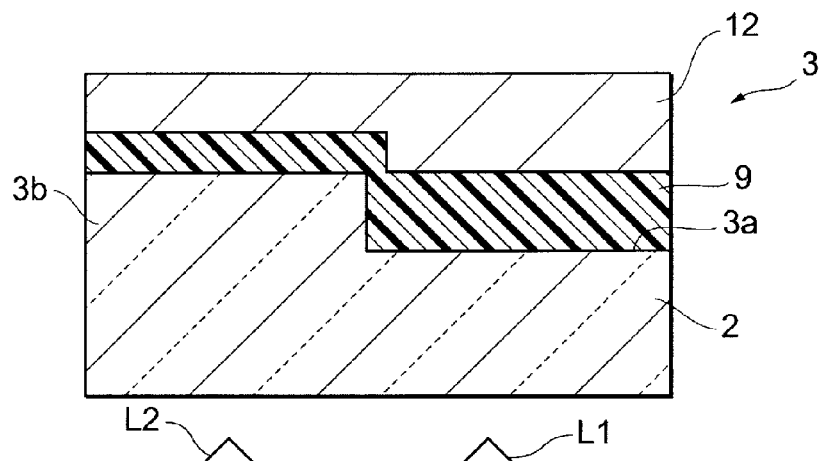
FIGS. 13A and 13B are schematic step views illustrating a method for producing a diffractive optical element according to a third modification of the first embodiment.
Figure 13B:
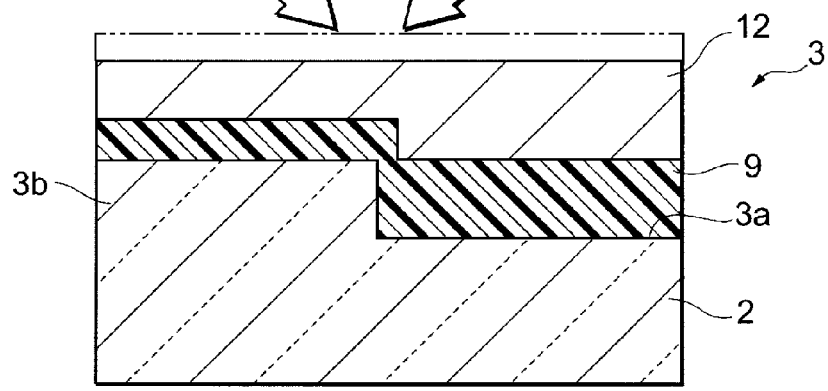

FIGS. 13A and 13B are schematic step views illustrating a method for producing a diffractive optical element (a fine structure) according to a third modification. There are shown only parts different from the production method shown in FIGS. 6A to 7B, without the same parts as those in the method.

First, similarly to the above method, on the first surface of the substrate 2 are formed the diffractive structural section 3 including the concave portions 3a and the convex portions 3b (See FIG. 6A), as well as the photosensitive film 9 is formed to cover the diffractive structural section 3 (See FIG. 6B).

After that, a water-soluble film 12 is formed in a surface of the photosensitive film 9 (FIG. 13A). For example, spin coating is used to form the water-soluble film 12. Adjusting a viscosity or the like of the water-soluble film 12 as appropriate allows level difference on the surface of the photosensitive film 9 to be reduced by the water-soluble film 12. An example of the water-soluble film 12 may be a reflection preventing film applied on a surface of a photo resist and, for example, known as TSP series (produced by Tokyo Ohka Kogyo Co., Ltd.). Using the water-soluble film 12 allows the parallel plate 11 used in the above embodiment to be omitted. The water-soluble film 12 has a refractive index larger than 1 and equal to or smaller than the refractive index of the photosensitive film 9. For example, the refractive index of the water-soluble film 12 may be approximately 1.40 to 1.50. It is better for the refractive index of the water-soluble film 12 to be closer to the refractive index of the photosensitive film 9.

Next, via the water-soluble film 12, laser interference exposure is performed into the photosensitive film 9 formed in the first surface of the substrate 2 (FIG. 13B). Conditions for the laser interference exposure are the same as those described above. As in the method of the first embodiment, the laser interference exposure may be performed twice.

As shown by a virtual line (a double-dotted chain line) in FIG. 13B, on a side of the water-soluble film 12 where the laser beam is input, there may be arranged the parallel plate 11 with the diffraction grating 14 shown in FIGS. 8A to 12C to perform the laser interference exposure using one of the laser beams L1 and L2.

Figure 6D:
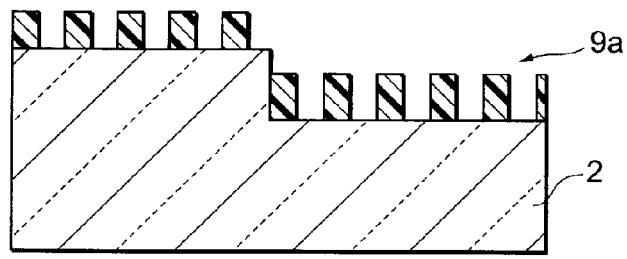

Next, the photosensitive film 9 is developed (See FIG. 6D). In this case, the water-soluble film 12 can be easily removed because of its water solubility. Specifically, the water-soluble film 12 may be removed before the exposure of the photosensitive film 9; or the photosensitive film 9 may be developed without removing the water-soluble film 12. In other words, removal of the water-soluble film 12 before developing the photosensitive film 9 is not essential. When the photosensitive film 9 is developed while leaving the water-soluble film 12 unremoved, the water-soluble film 12 can be dissolved simultaneously with formation of a pattern on the photosensitive film 9. Then, the photosensitive film pattern 9a thus formed is used as a mask to perform etching (See FIG. 7A), whereby an image of the photosensitive film pattern 9a is transferred to the substrate 2, followed by removal of the photosensitive film pattern 9a (See FIG. 7B). As a result, on the first surface of the substrate 2 is formed the grid section 4 (the fine convex portions 4a) along the surfaces of the concave and the convex portions 3a and 3b of the diffractive structural section 3.

Thus, in the production methods according to the first embodiment and the modifications thereof, on the photosensitive film is arranged the liquid having a higher refractive index than that of air or the water-soluble film equivalent to the liquid to perform the laser interference exposure under the condition. Arranging the liquid or the water-soluble film reduces refractive-index difference between the photosensitive film and media in contact with the photosensitive film (the liquid and the parallel plate), as compared to when interference field is directly input to the photosensitive film (namely, when the photosensitive film in contact with air is exposed to the light). This suppresses diffraction of the interference field caused by an uneven surface of the photosensitive film, thereby preventing disturbance of intensity distribution of the interference field in the photosensitive film.

Accordingly, the methods of the first embodiment and the modifications thereof can produce a high-quality fine structure that ensures excellent exposure on an uneven surface.

The diffractive optical element produced by the method of each of the embodiment and the modifications thereof has a grid structure (a sub-wavelength structure) superimposed on a surface of a diffractive structure formed in a glass substrate. For example, the diffractive optical element is used to split an incident laser beam into a plurality of beams or to perform laser beam shaping such as changing of energy distribution. The sub-wavelength structure provides a reflection preventing function to reduce reflection loss of incident light, thereby obtaining a high light-use efficiency. The diffractive optical element is particularly suitable to a case of using UV light or infrared light in which there is no appropriate reflection-preventing film material found at present.

The first embodiment has described the diffractive optical element as an example of the fine structure. However, the scope of the present invention is not restricted to that and can be applied to production of various kinds of fine structures. Additionally, although the embodiment uses the fused silica glass substrate as an example of the substrate 2, the substrate 2 may be a semiconductor substrate (e.g. a silicon substrate) or a metal substrate (e.g. a nickel substrate), for example. The fine structure formed in the semiconductor substrate or the metal substrate can also be used as a molding tool.

Second Embodiment

Figure 14:
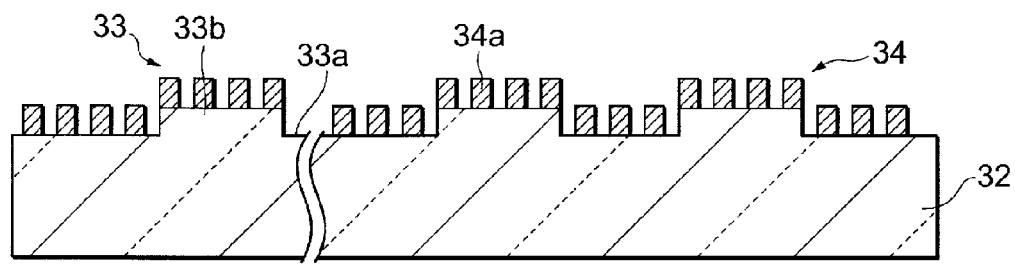
FIG. 14 is a schematic view showing a cross-sectional configuration of an optical element produced by a method according to a second embodiment of the invention.

FIG. 14 is a schematic view showing a cross-sectional configuration of a diffractive optical element as an example of a fine structure according to a second embodiment of the invention. A diffractive optical element (an optical element) 31 of the embodiment shown in FIG. 14 includes a substrate 32, a diffractive structural section 33, and a grid section (a non-diffractive structural section) 34. Among them, the substrate 32 and the diffractive structural section 33 are the same as the substrate 2 and the diffractive structural section 3 in the first embodiment. Thus, detailed descriptions thereof will be omitted. The diffractive optical element 31 of the second embodiment is different from the diffractive optical element 1 of the first embodiment in that the grid section 34 includes a plurality of fine convex portions 34a made of a metal.

The grid section 34 is provided on a first surface of the substrate 32 and along an upper surface of the diffractive structural section 33. The grid section 34 of the embodiment includes the fine convex portions 34a smaller than the convex portions 3b of the above-described diffractive structural section 3. The fine convex portions 34a are made of a metal. For example, the present embodiment uses the fine convex portions 34a made of aluminum. The fine convex portions 34a of the grid section 34 are fringe-shaped and extended in a single direction (the Y-axis direction in the drawing), as shown in FIG. 2A of the first embodiment described above, as well as are cyclically arranged in the X-axis direction, for example. The grid section 34 thus arranged exhibits a polarization separation function. That is, the diffractive optical element 31 of the embodiment has both of a diffractive function by the diffractive structural section 33 and the polarization separation function by the grid section 34.

Figure 15A:
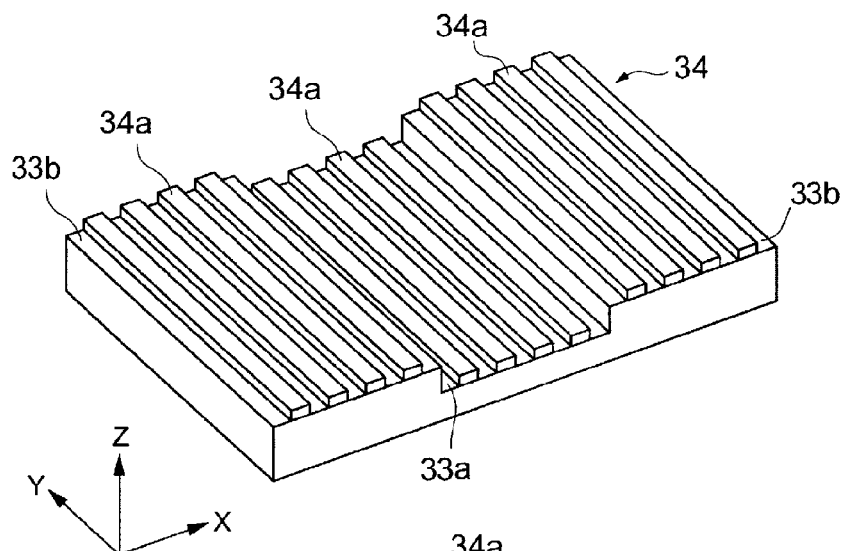
FIGS. 15A to 15C are schematic perspective views shown by partially enlarging the diffractive structural section and the grid section.
Figure 15B:
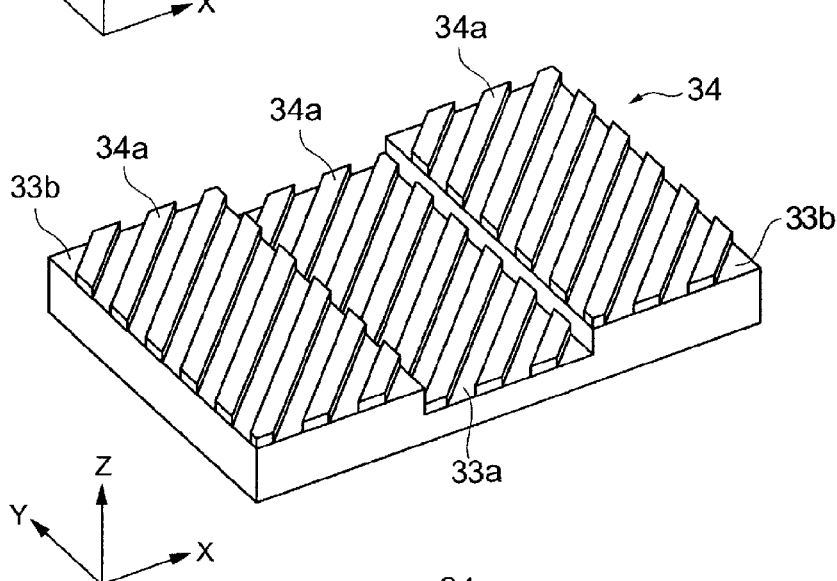
Figure 15C:
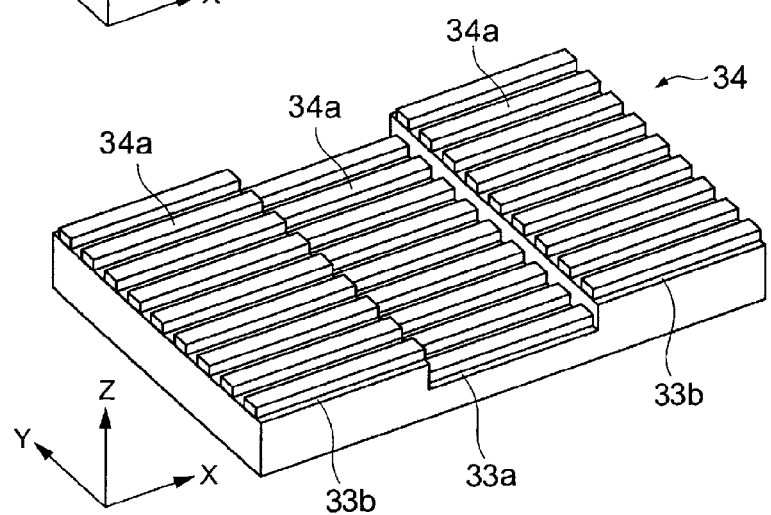

FIGS. 15A to 15C are schematic perspective views shown by partially enlarging the diffractive structural section 33 and the grid section 34. A suitable relative arrangement between the diffractive structural section 33 and the fine convex portions 34a of the grid section 34 as a one-dimensional grid is the same as that of the first embodiment described above. That is, the relative arrangement between the diffractive structural section 33 and the fine convex portions 34a may be made as shown in FIG. 15A, for example. Specifically, in an example of FIG. 15A, the concave portions 33a and the convex portions 33b of the diffractive structural section 33 are extended in the Y-axis direction of the drawing and also arranged alternately in the X-axis direction thereof. Similarly, the fine convex portions 34a of the grid section 34 are provided as in the concave and the convex portions 33a and 33b. In short, the extending direction of the concave and the convex portions 33a and 33b is parallel to the extending direction of the fine convex portions 34a.

Additionally, in the relative arrangement between the diffractive structural section 33 and the grid section 34 is, preferably, the extending direction of the concave and the convex portions 33a and 33b intersects with the extending direction of the fine convex portions 34a at a predetermined angle, as shown in FIGS. 15B and 15C. Specifically, in an example of FIG. 15B, the concave and the convex portions 33a and 33b of the diffractive structural section 33 are extended in the Y-axis direction and also arranged alternately in the X-axis direction. In contrast, the fine convex portions 34a of the grid section 34 are extended in a direction intersecting with the Y-axis direction at an angle of approximately 45 degrees and also arranged alternately in a direction orthogonal to the intersecting direction.

In an example of FIG. 15C, the concave and the convex portions 33a and 33b of the diffractive structural section 33 are extended in the Y-axis direction and also arranged alternately in the X-axis direction, whereas the fine convex portions 34a of the grid section 34 are extended in a direction intersecting with the Y-axis direction at an angle of approximately 90 degrees (namely, in the X-axis direction) and also arranged alternately in a direction orthogonal to the intersecting direction (namely, in the Y-axis direction). In this manner, allowing the concave portions 33a and the convex portions 33b to intersect with the fine convex portions 34a makes it easier to form the fine convex portions 34a near stepped portions between the concave and the convex portions 33a and 33b. The intersecting angle between the extending direction of the concave and the convex portions 33a and 33b and the extending direction of the fine convex portions 34a can be determined as appropriate. The intersection angles of 45 and 90 degrees used as the above examples are preferable because such angles are often used in optical systems in general.

Next will be described a method for producing the above-structured diffractive optical element 31 according to the present embodiment.

FIGS. 16A to 17C are schematic step views showing an example of the method of the diffractive optical element 31. Each of the drawings shows an enlarged part of a cross-section of the diffractive optical element 31, and the same parts as those in the first embodiment will not be described.

Figure 16A:
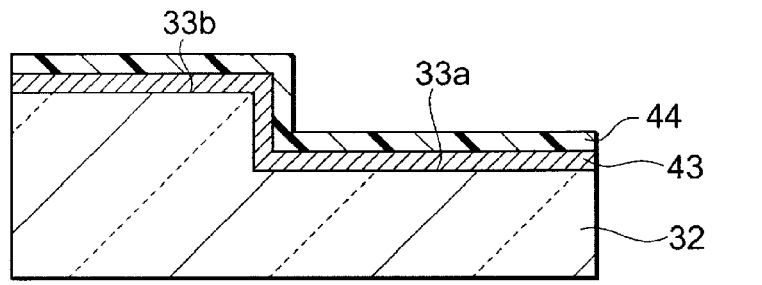
FIGS. 16A to 16D are schematic cross-sectional views illustrating the method for producing the diffractive optical element (a fine structure) according to the second embodiment.

At a first step, on the first surface of the substrate 32 is formed the diffractive structural section 33 including the concave portions 33a and the convex portions 33b (FIG. 16A). The present step can be performed using well-known photolithography and etching, for example. Next, a metal film 43 is formed to cover the diffractive structural section 33, and then, a reflection preventing film (a first reflection preventing film) 44 is formed to cover the metal film 43 (FIG. 16A). As described above, the metal film 43 is suitably an aluminum film having a thickness of an approximately 120 nm, for example, and may be deposited using a physical vapor deposition (PVD) method such as sputtering. Additionally, the reflection preventing film 44 may be suitably an $SnO_2$ film having a thickness of approximately 90 nm, for example, or may be made of SiON.

Figure 16B:
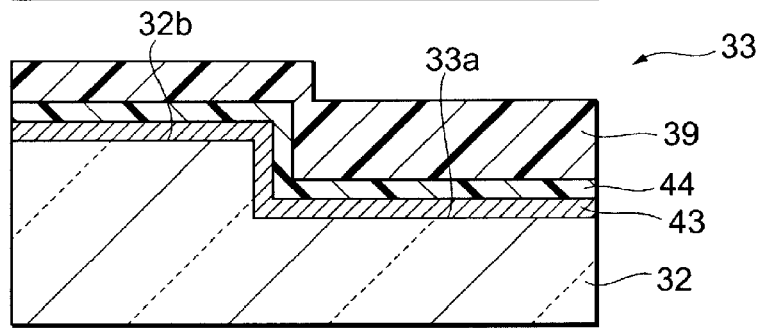

At a next step, on the first surface of the substrate 2 is formed a photosensitive film 39 to cover the metal film 43 and the reflection preventing film 44 on the diffractive structural section 33 (FIG. 16B). Details of the present step are the same as those of the first embodiment.

Figure 16C:
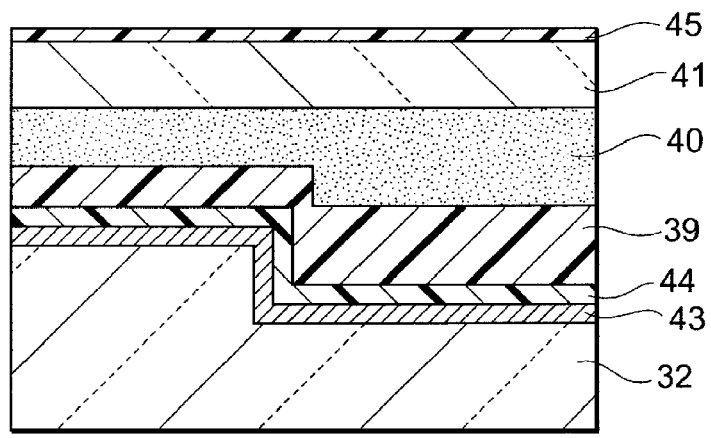

Then, a liquid (a liquid film) 40 having a high refractive index is provided on the photosensitive film 39, and a transparent parallel plate 41 is arranged such that the plate opposes the substrate 32 via the liquid 40 (FIG. 16C). Details of the step are also the same as in the first embodiment. Specifically, as shown in the drawing, preferably, the parallel plate 41 has a reflection preventing film (a second reflection preventing film) 45 on a surface of the plate where a plurality of laser beams described below are input. In this case, the reflection preventing film 45 may be a dielectric multi-layer film or the like.

Figure 16D:
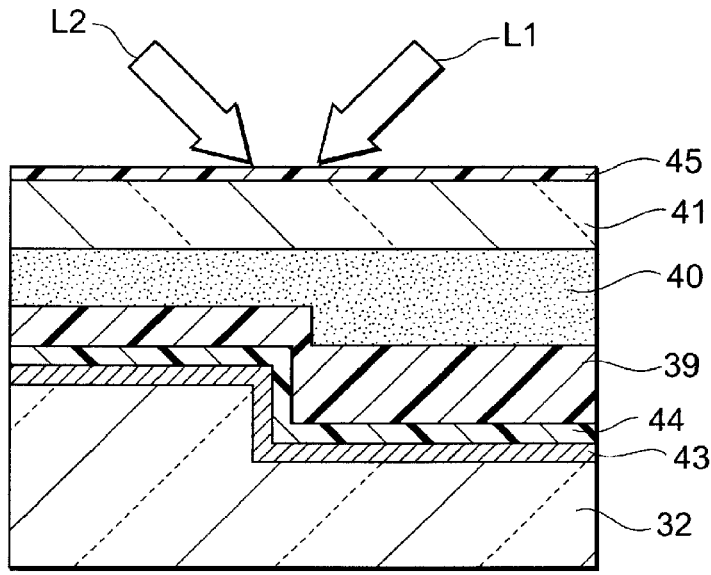

Next, via the liquid 40 and the parallel plate 41, laser interference exposure is performed into the photosensitive film 39 formed in the first surface of the substrate 32 (FIG. 16D). Details of the step are also similar to those in the first embodiment. Through the step, a latent image pattern corresponding to a pitch between interference fringes is formed in the photosensitive film 39. Providing the reflection preventing film 45 on the parallel plate 41 as above allows reflected light occurring at a boundary between an air layer and the parallel plate 41 to be suppressed, thus enabling exposure unevenness to be further reduced. Depending on precision or the like required for the diffractive optical element 31 as the fine structure, the exposure unevenness may be permitted to some extent. Additionally, depending on a refractive-index balance among the parallel plate 41, the liquid 40, and the photosensitive film 39, it may be possible to suppress reflected light at a boundary between the air layer and the parallel plate 41 to a practically acceptable extent. Thus, it is not essential to provide the reflection preventing film 45 on the parallel plate 41.

Next, the photosensitive film 39 having the latent image pattern formed by the interference field is developed (FIG. 17A) to form a photosensitive film pattern 39*a*. The photosensitive film pattern 39*a* has a cycle corresponding to the pitch between the interference fringes, as shown in the drawing.

Figure 17A:
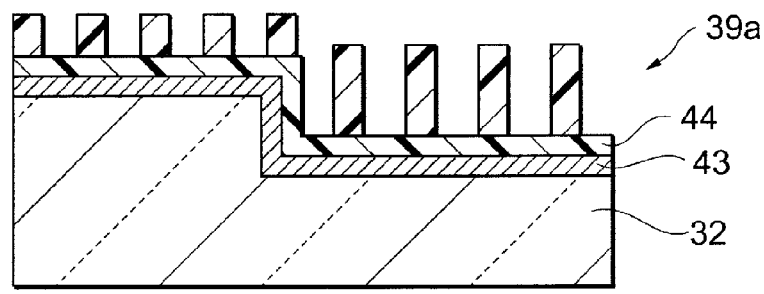
FIGS. 17A to 17C are also schematic cross-sectional views illustrating the method for producing the diffractive optical element (the fine structure) according to the second embodiment.
Figure 17B:
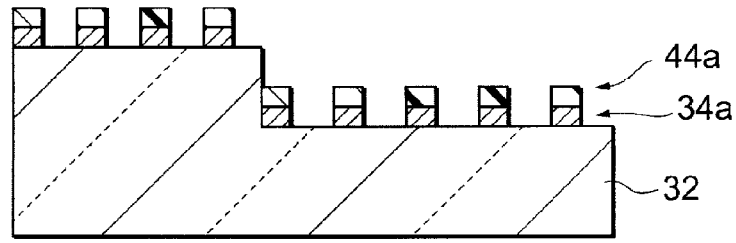

Next, etching such as dry etching is performed using a mask of the photosensitive film pattern 39*a* (FIG. 17B). Thereby, as in the drawing, an image of the photosensitive film pattern 39*a* is transferred to the reflection preventing film 44 and the metal film 43, and then, the photosensitive film pattern 39*a* is removed (FIG. 17B). Thus, on the first surface of the substrate 32, the grid section 34 (the fine convex portions 34*a*) is formed along surfaces of the concave and the convex portions 33*a* and 33*b* of the diffractive structural section 33, as shown in the drawing. A film pattern 44*a* obtained by transferring the image of the photosensitive-film pattern 39*a* onto the reflection preventing film 44 is removed or not according to need (See FIG. 17C).

Next will be described a method according to a first modification of the second embodiment.

Figure 18A:
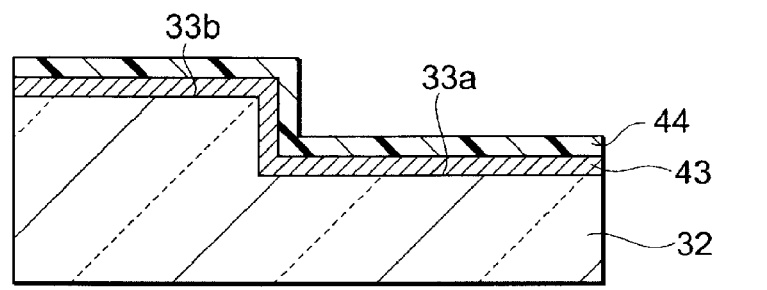
FIGS. 18A to 18D are schematic step views illustrating a method for producing a diffractive optical element (a fine structure) according to a first modification of the second embodiment.

First, as in the method of the second embodiment, on the first surface of the substrate 32 is formed the diffractive structural section 33 including the concave portions 33*a* and the convex portions 33*b*. Then, the metal film 43 is formed to cover the diffractive structural section 33, and furthermore, the reflection preventing film (the first reflection preventing film) 44 is formed to cover the metal film 43 (FIG. 18A).

Figure 18B:
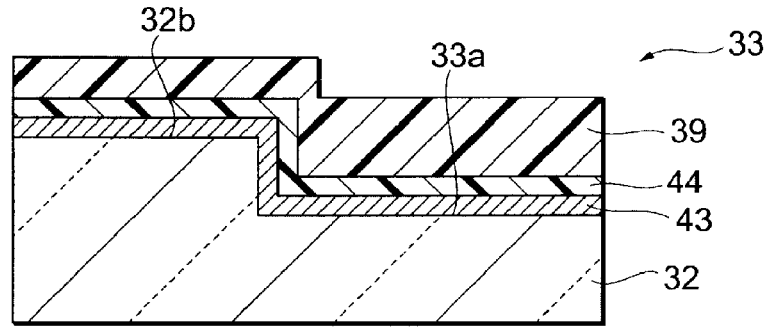

Next, similarly, the photosensitive film 39 is formed to cover the metal film 43 and the reflection preventing film 44 on the diffractive structural section 33 (FIG. 18B).

Figure 18C:
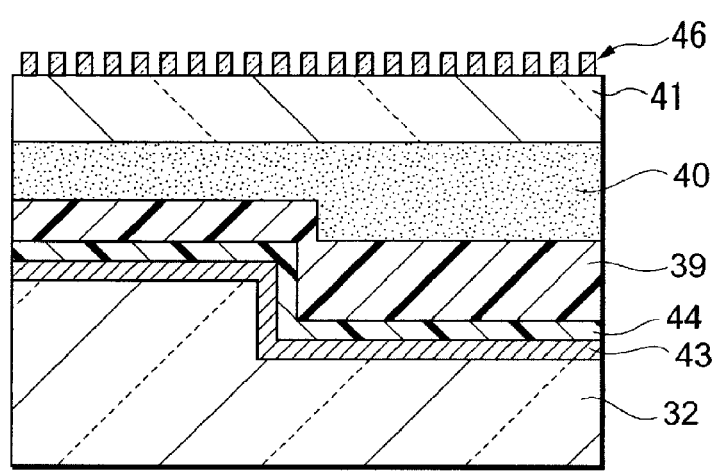

On the photosensitive film 39 is arranged the liquid (the liquid film) 40 having a high refractive index. The transparent parallel plate 41 is arranged such that the plate opposes the substrate 32 via the liquid 40 (FIG. 18C). The present modification includes a diffraction grating 46 that is provided on the surface of the parallel plate 41 where the laser beam is input, similarly to that in the modifications of the first embodiment.

Figure 18D:
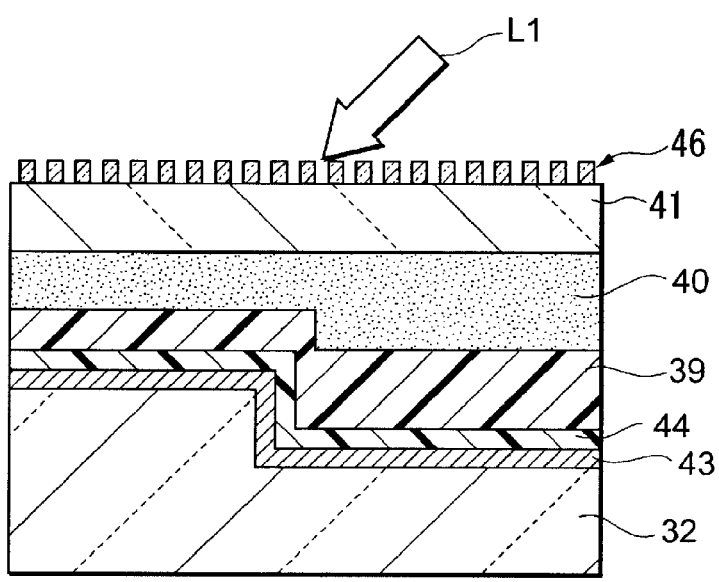

Next, via the liquid 10 and the parallel plate 11, laser interference exposure is performed into the photosensitive film 39 formed in the first surface of the substrate 2 (FIG. 18D). A light source for the laser interference exposure is the same as the laser used in the above-described production method. A single laser beam L1 output from the laser is input to the diffraction grating 46 at a predetermined angle to generate light (interference field) including interference fringes of cyclical bright and dark domains. Irradiating the photosensitive film 39 with the interference field allows a latent image pattern corresponding to the pitch between the interference fringes to be formed in the photosensitive film 39, as in the above production method.

Figure 17C:
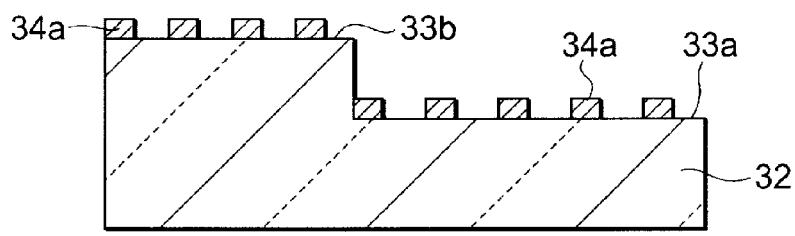

Next, similarly, the photosensitive film 39 is developed; etching is performed using a mask of the photosensitive film pattern 39*a*; and the photosensitive film pattern 39*a* is removed (See FIGS. 17A to 17C). As a result, on the first surface of the substrate 32, the grid section 34 (the fine convex portions 34*a*) is formed along the surfaces of the concave and the convex portions 33*a* and 33*b* of the diffractive structural section 33, as shown in the drawing.

Next will be described a production method according to a second modification of the second embodiment. In the method of the second embodiment, the liquid 40 having a high refractive index is retained by the parallel plate 41. However, using a water-soluble film instead of the liquid 40 allows the parallel plate 41 to be omitted.

Figure 19A:
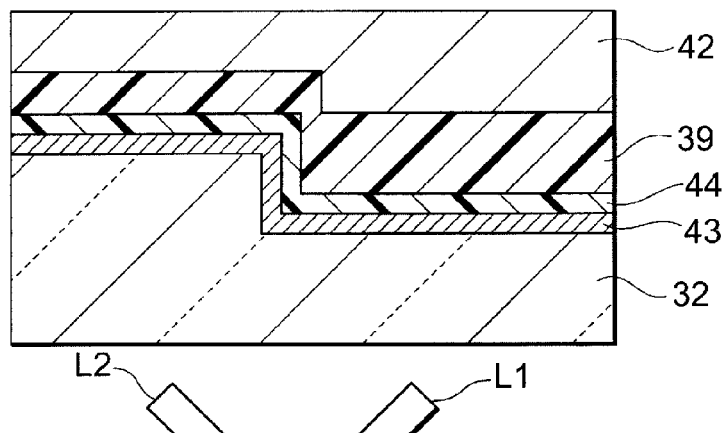
FIGS. 19A and 19B are schematic step views illustrating a method for producing a diffractive optical element (a fine structure) according to a second modification of the second embodiment.
Figure 19B:
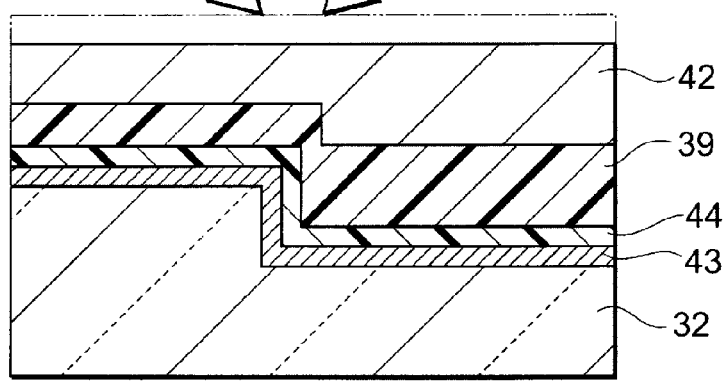

FIGS. 19A and 19B are schematic step views illustrating the method for producing a diffractive optical element (a fine structure) according to the second modification. In those drawings, there are shown only parts different from those of the method shown in FIGS. 16A to 17C, and the same parts as those in the method are omitted.

First, similarly to the method of the second embodiment, on the first surface of the substrate 32 are formed the diffractive structural section 33 including the concave and the convex portions 33*a* and 33*b*, the metal film 43, and the reflection preventing film 44 (See FIG. 16A). Additionally, the photosensitive film 39 is formed to cover the reflection preventing film 44 (See FIG. 16B).

Thereafter, the water-soluble film 42 is formed in the photosensitive film 39 (FIG. 19A). Details of the water-soluble film 42 are the same as those of the water-soluble film 12 included in one of the above-described modifications of the first embodiment.

Next, via the water-soluble film 42, laser interference exposure is performed into the photosensitive film 39 formed in the first surface of the substrate 32 (FIG. 19B). Conditions for the laser interference exposure are the same as those described above.

As shown by a virtual line (a double-dotted chain line) in FIG. 19B, on a side of the water-soluble film 42 where the laser beam is input, there may be provided the parallel plate 41 with the diffraction grating 46 shown in FIG. 18A to perform the laser interference exposure using one of the laser beams L1 and L2.

Next, the photosensitive film 39 is developed (See FIG. 17A). In this case, the water-soluble film 42 can be easily removed because of its water solubility. Specifically, the water-soluble film 42 may be removed before the exposure of the photosensitive film 39, or the photosensitive film 39 may be developed without removing the water-soluble film 42. In other words, removing the water-soluble film 42 before developing the photosensitive film 39 is not essential. When the photosensitive film 39 is developed while leaving the water-soluble film 42 unremoved, the water-soluble film 42 can be dissolved simultaneously with formation of a pattern on the photosensitive film 39. Then, the photosensitive film pattern 39a thus formed is used as a mask to perform etching (See FIG. 17B), whereby an image of the photosensitive film pattern 39a is transferred onto the metal film 43 and the reflection preventing film 44. After that, the photosensitive film pattern 30a is removed (See FIG. 17B). Thereby, on the first surface of the substrate 32 is formed the grid section 34 (the fine convex portions 34a) along the surfaces of the concave and the convex portions 33a and 33b of the diffractive structural section 33.

As described above, in the methods of the second embodiment and the modifications thereof, on the photosensitive film is arranged the liquid having a higher refractive index than that of air or the water-soluble film equivalent to the liquid to perform the laser interference exposure, as in the first embodiment and the modifications thereof. Arranging the liquid or the water-soluble film reduces refractive-index difference between the photosensitive film and media in contact with the photosensitive film (the liquid and the parallel plate), as compared to when interference field is directly input to the photosensitive film (when the photosensitive film in contact with air is exposed to the light). This suppresses diffraction of the interference field caused by an uneven surface of the photosensitive film, thereby preventing disturbance of intensity distribution of the interference field in the photosensitive film. Accordingly, the methods of the second embodiment and the modifications thereof ensure excellent exposure on a not-flat surface and thus can produce a high-quality fine structure.

In the diffractive optical element produced by any one of the methods of the second embodiment and the modifications thereof, the one-dimensional grid structure (the sub-wavelength structure) made of the metal film is superimposed on the surface of the diffractive structure formed in the glass substrate. The diffractive optical element thus structured may be used to diffuse an incoming laser beam or to perform beam shaping such as changing of energy distribution, for example. Using the polarization separation function of the sub-wavelength structure allows only one of polarized components of incident light to be diffused and reflected in a high light-use efficiency. The diffractive optical element having the polarization separation function is suitably used, for example, as a component included in a display unit of a mobile apparatus such as a mobile phone or as a component included in an optical modulation unit of a liquid crystal projector.

In the second embodiment and the modifications thereof, the diffractive optical element is merely an example of the fine structure. However, the scope of the present invention is not restricted to that and is applicable to production of various kinds of fine structures.

Other Embodiments

Other embodiments of the invention will be described.

Figure 20:
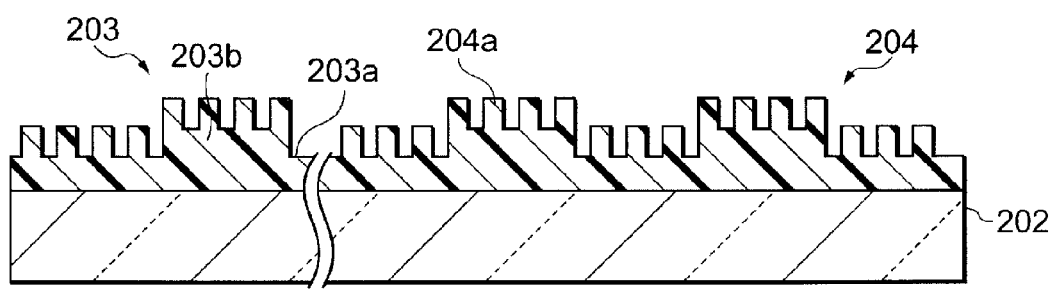
FIG. 20 is a schematic view showing a cross-sectional configuration of a diffractive optical element produced by a method according to another embodiment of the invention.

In the embodiments above, the diffractive structural section is formed by processing (such as etching) of the first surface of the substrate. However, there are alternative methods. Specifically, on the first surface of the substrate is formed a polymer (a polymer resin) film transparent to a predetermined light wavelength to be used. Then, exposure using a photo mask and wet etching is performed in the polymer film, whereby there can be produced a diffractive optical element similar to the above-described element. FIG. 20 shows a structural example of an optical element thus produced. A diffractive optical element 201 shown in FIG. 20 corresponds to the first embodiment described above. In this case, on a first surface of a substrate 202 made of glass or the like are arranged a diffractive structural section 203 and a grid section 204 formed with the polymer film. The diffractive structural section 203 includes concave portions 203a and convex portions 203b. Additionally, the grid section 204 includes a plurality of fine convex portions 204a and is arranged along surfaces of the concave and the convex portions 203a and 203b. The optical element 201 of the present embodiment also corresponds to the optical element of the second embodiment described above, although descriptions and illustrations for that are omitted.

Figure 21:
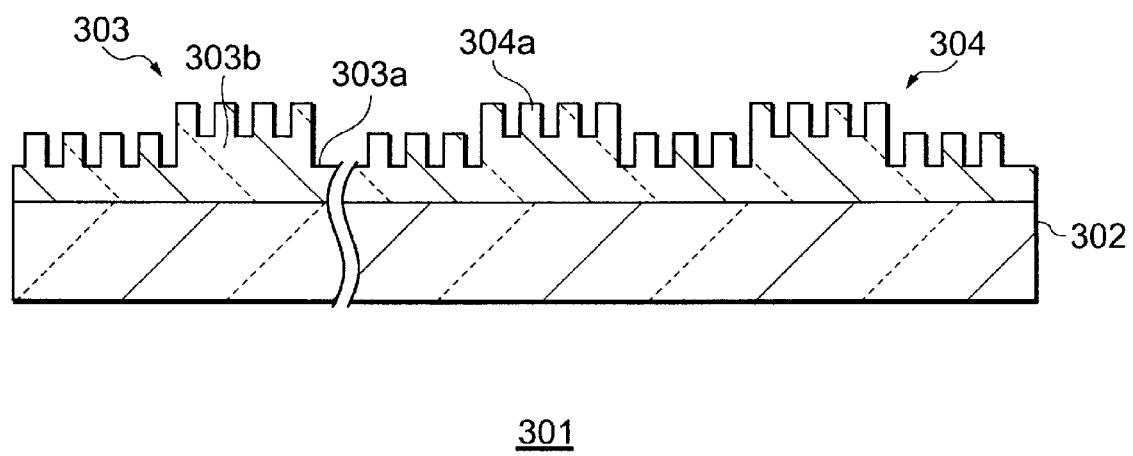
FIG. 21 is a schematic view showing a cross-sectional configuration of a diffractive optical element produced by a method according to another embodiment of the invention.

Other than the above method, molding can be used. For example, a substrate and a diffractive structural section may be integrally molded by using a glass material with a high refractive index (approximately 2.0) transparent to a light wavelength to be used. In this case, using the glass having such a high refractive index allows a depth g of the diffractive structural section to be made smaller, which is preferable in terms of formation of the grid section. Alternatively, another film (for example, an inorganic film such as a $SiO_2$ film) may be formed in the substrate to be selectively etched so as to form the diffractive structural section. FIG. 21 shows a structural example of an optical element thus produced. An optical element 301 shown in FIG. 21 corresponds to the above first embodiment. In the optical element 301, on a first surface of a substrate 301 made of glass or the like is arranged a diffractive structural section 303 formed of an $SiO_2$ film or the like. The diffractive structural section 303 includes concave portions 303a and convex portions 303b. Along surfaces of the concave and the convex portions 303a and 303b, there is arranged a grid section 304 including a plurality of fine convex portions 304a. The optical element 301 also corresponds to the element of the second embodiment, although descriptions and illustrations for that are omitted.

Furthermore, as the concave and convex structure of the first surface of the substrate, there may be a concave and convex structure originally present on a substrate (for example, the substrate simply has an uneven surface), other than the diffractive structural section provided on the substrate to perform some function in the above embodiments. The invention can be applied to even such a structure.

What is claimed is:

1. A method for producing a fine structure, comprising:
   (a) forming a photosensitive film to cover a plurality of first convex portions formed in at least one surface of a substrate;
   (b) arranging liquid to cover the photosensitive film;
   (c) arranging a transparent parallel plate such that the parallel plate is opposite to the substrate via the liquid;
   (d) generating interference field by a laser beam to irradiate the interference field onto the photosensitive film via the parallel plate and the liquid;
   (e) removing the liquid and the parallel plate to develop the photosensitive film so as to form a photosensitive film pattern; and
   (f) etching the substrate using a mask of the photosensitive film pattern to form a plurality of fine convex portions smaller than the first convex portions on the at least one surface of the substrate, wherein the liquid arranged at step (b) has a first refractive index larger than 1 and equal to or smaller than a second refractive index of the photosensitive film.

2. The method for producing a fine structure according to claim 1, wherein the laser beam used at step (d) includes a plurality of laser beams that are intersected to generate the interference field.

3. The method for producing a fine structure according to claim 1, wherein the parallel plate arranged at step (c) has a diffraction grating, and the laser beam used at step (d) is a single laser beam that is input to the diffraction grating to generate the interference field.

4. The method for producing a fine structure according to claim 3 further including forming a light-shielding layer having at least one opening on a surface of the parallel plate facing the liquid at step (c).

5. The method for producing a fine structure according to claim 4 further including forming a plurality of openings as the at least one opening at step (c); and sequentially placing a shielding plate above the parallel plate to expose each of the openings so as to irradiate the interference field onto a plurality of regions on the at least one surface of the substrate at step (d).

6. The method for producing a fine structure according to claim 4 further including forming a single opening as the at least one opening at step (c); and moving the parallel plate to irradiate the interference field onto a plurality of regions on the at least one surface of the substrate at step (d).

7. A method for producing a fine structure, comprising:
   (a) forming a photosensitive film to cover a plurality of first convex portions formed in at least one surface of a substrate;
   (b) forming a water-soluble film to cover the photosensitive film;
   (c) generating interference field by a laser beam to irradiate the interference field onto the photosensitive film via the water-soluble film;
   (d) developing the photosensitive film to form a photosensitive film pattern; and
   (e) etching the substrate using a mask of the photosensitive film pattern to form a plurality of fine convex portions smaller than the first convex portions on the at least one surface of the substrate,
wherein the water-soluble film formed at step (b) has a first refractive index larger than 1 and equal to or smaller than a second refractive index of the photosensitive film.

8. The method for producing a fine structure according to claim 7, wherein the laser beam used at step (c) includes a plurality of laser beams that are intersected to generate the interference field.

9. The method for producing a fine structure according to claim 7, wherein, at step (d), the photosensitive film is developed after removing the water-soluble film.

10. The method for producing a fine structure according to claim 7 further including forming the first convex portions on the at least one surface of the substrate before step (a).

11. The method for producing a fine structure according to claim 1 further including removing the photosensitive film pattern after etching the substrate.

12. The method for producing a fine structure according to claim 2 further includes forming a reflection preventing film on a surface of the parallel plate where the laser beams are input.

* * * * *